US012699822B2

(12) United States Patent
Fisher et al.

(10) Patent No.: US 12,699,822 B2
(45) Date of Patent: Aug. 4, 2026

(54) GRAPHICAL USER INTERFACES AND COMPUTING SYSTEMS FOR CONTEXTUAL DISCRETE CHOICE EXPERIMENTS

(71) Applicant: JMP Statistical Discovery LLC, Cary, NC (US)

(72) Inventors: William Smith Fisher, Seneca, SC (US); Jacob Davis Rhyne, Dallas, NC (US); Mark Wallace Bailey, Haddonfield, NJ (US); Joseph Albert Morgan, Raleigh, NC (US); Ryan Adam Lekivetz, Cary, NC (US)

(73) Assignee: JMP STATISTICAL DISCOVERY LLC, Cary, NC (US)

( * ) Notice: Subject to any disclaimer, the term of this patent is extended or adjusted under 35 U.S.C. 154(b) by 0 days.

(21) Appl. No.: 18/967,881

(22) Filed: Dec. 4, 2024

(65) Prior Publication Data

US 2026/0050715 A1 Feb. 19, 2026

Related U.S. Application Data

(60) Provisional application No. 63/682,934, filed on Aug. 14, 2024.

(51) Int. Cl.
*G06F 30/27* (2020.01)

(52) U.S. Cl.
CPC .................................. *G06F 30/27* (2020.01)

(58) Field of Classification Search
CPC ........ G06F 30/27; G06F 18/27; G06F 3/0482; G16B 40/30
See application file for complete search history.

(56) References Cited

U.S. PATENT DOCUMENTS 10,386,271 B1 * 8/2019 King .................. G01M 99/005
2009/0125270 A1 * 5/2009 O'Shea ................ G06F 11/263
702/108

(Continued)

OTHER PUBLICATIONS

JMP. "Design of Experiments Guide Version 16". 20021. 844 Pages. (Year: 2021).*

(Continued)

*Primary Examiner* — Eunhee Kim
(74) *Attorney, Agent, or Firm* — COATS & BENNETT, PLLC

(57) ABSTRACT

A computing system obtains multiple factors for a first environment in a first experiment. The multiple factors include one or more profile factors and one or more subject factors. Each profile factor of the one or more profile factors specifies multiple candidate features for the first environment. Each subject factor of the one or more subject factors specifies multiple candidate levels categorizing different subjects interacting with the first environment. The computing system obtains a predictive model for predicting probabilities of multiple candidate outcomes for the first environment. The predictive model has weighted model terms. The computing system receives a selection of a first level for a first subject factor of the one or more subject factors. The computing system generates a computer-generated representation of a fixed-factor model. The fixed-factor model predicts multiple candidate outcomes for a second environment with subjects defined by the selection of the first level.

30 Claims, 24 Drawing Sheets

(56) References Cited

U.S. PATENT DOCUMENTS

| | | | | |
|---|---|---|---|---|
| 2017/0300657 | A1* | 10/2017 | Barrett | G16H 50/50 |
| 2021/0124858 | A1* | 4/2021 | Morgan | G06F 30/23 |
| 2023/0040772 | A1* | 2/2023 | Lekivetz | G06F 3/0482 |
| 2023/0281347 | A1* | 9/2023 | Jones | G06F 30/12 703/2 |

OTHER PUBLICATIONS

Kuhfeld, W., “Discrete Choice”, 2010, pp. 1-379.
Crabbe, M., et al., “Improving the efficiency of individualized designs for the mixed logit choice model by including covariates”, 2012, pp. 1-14.
Rhyne, J., et al., “Assessing the Usability of Statistical Software Using a Discrete Choice Experiment”, 2024, pp. 1-11.
Rhyne, J., et al., “Assessing the Usability of Statistical Software Using Designed Experiments”, 2023, pp. 1-8.
Kessels, R., et al., “Bayesian optimal designs for discrete choice experiments with partial profiles”, May 2, 2011, pp. 1-23.
Tan, C., et al., “Incorporating customer personalization preferences in open product architecture design”, Mar. 17, 2020, pp. 1-12, Elsevier Ltd.
Berke, A., et al., “Drone delivery and the value of customer privacy: A discrete choice experiment with U.S. consumers”, Feb. 27, 2023, pp. 1-26, Elsevier Ltd.
Luo, H., et al., “What motivates the use of shared mobility systems and their integration with public transit? Evidence from a choice experiment study”, Dec. 28, 2022, pp. 1-21.
Muhlbacher, A., et al., “Personalized diabetes management: what do patients with diabetes mellitus prefer? A discrete choice experiment”, Sep. 18, 2018, pp. 1-19.

* cited by examiner

| Survey 1122 | Choice Set 1124 | Position 1126 | Image 1128 | Pick 1128 | Subject 1130 | Color Preference 1132 | Preview Column 1134 | Preview Legend 1136 | Hover Help Preference 1138 |
|---|---|---|---|---|---|---|---|---|---|
| 1 | 9 | 1 | Screenshots/Choice Design 2/Preview Column/Alt 1 Alt 1 Status Quo.png | 1 | 11414938943 | Green and Red | Appended to the term name | Below the plot | Hovering over the plot |
| 1 | 9 | 2 | Screenshots/Choice Design 2/Preview Column/Status Quo Status Quo Alt 1.png | 0 | 11414938943 | Green and Red | Appended to the term name | Below the plot | Hovering over the plot |
| 1 | 10 | 1 | Screenshots/Choice Design 2/Preview Column/Alt 1 Alt 1 Alt 1.png | 0 | 11414938943 | Green and Red | Appended to the term name | Below the plot | Hovering over the plot |
| 1 | 10 | 2 | Screenshots/Choice Design 2/Confidence Interval/Status Quo Status Quo Alt 1.png | 1 | 11414938943 | Green and Red | Appended to the term name | Below the plot | Hovering over the plot |
| 1 | 9 | 1 | Screenshots/Choice Design 2/Preview Column/Alt 1 Alt 1 Status Quo.png | 1 | 1977841717 | No preference | Column to the left of the plot | Above the plot | Hovering over the Preview Column |
| 1 | 9 | 2 | Screenshots/Choice Design 2/Preview Column/Status Quo Status Quo Alt 1.png | 0 | 1977841717 | No preference | Column to the left of the plot | Above the plot | Hovering over the Preview Column |
| 1 | 10 | 1 | Screenshots/Choice Design 2/Preview Column/Alt 1 Alt 1 Alt 1.png | 1 | 1977841717 | No preference | Column to the left of the plot | Above the plot | Hovering over the Preview Column |
| 1 | 10 | 2 | Screenshots/Choice Design 2/Confidence Interval/Status Quo Status Quo Alt 1.png | 0 | 1977841717 | No preference | Column to the left of the plot | Above the plot | Hovering over the Preview Column |

| SURVEY 1122 | CHOICE SET 1124 | SUBJECT 1130 | TROUBLE IDENTIFYING COLOR? 1152 | JMP EXP. LEVEL 1154 | JMP EXP. RECORDED 1156 | DOE EXP. LEVEL 1158 | DOE EXP. LEVEL RECORD 1160 | USED EASY DOE BEFORE? 1162 | PREFERRED USAGE MODE 1164 | DATA TYPE VALIDATION 1166 |
|---|---|---|---|---|---|---|---|---|---|---|
| 1 | 9 | 11414938943 | NO | 2-5 YEARS | NEW USER-MODERATE EXPERIENCE | 2 - A LITTLE PRIOR DOE TRAINING | NEW-MODERATE | NO | I DONT USE EASY DOE | TRAINING |
| 1 | 9 | 11414938943 | NO | 2-5 YEARS | NEW USER-MODERATE EXPERIENCE | 2 - A LITTLE PRIOR DOE TRAINING | NEW-MODERATE | NO | I DONT USE EASY DOE | TRAINING |
| 1 | 10 | 11414938943 | NO | 2-5 YEARS | NEW USER-MODERATE EXPERIENCE | 2 - A LITTLE PRIOR DOE TRAINING | NEW-MODERATE | NO | I DONT USE EASY DOE | TRAINING |
| 1 | 10 | 11414938943 | NO | 2-5 YEARS | NEW USER-MODERATE EXPERIENCE | 2 - A LITTLE PRIOR DOE TRAINING | NEW-MODERATE | NO | I DONT USE EASY DOE | TRAINING |
| 1 | 9 | 2754218919 | NO | MORE THAN 5 YEARS | EXPERIENCED | 4 - EXPERIENCED WITH DOE | EXPERIENCED-EXPERT | NO | GUIDED | VALIDATION |
| 1 | 9 | 2754218919 | NO | MORE THAN 5 YEARS | EXPERIENCED | 4 - EXPERIENCED WITH DOE | EXPERIENCED-EXPERT | NO | GUIDED | VALIDATION |
| 1 | 10 | 2754218919 | NO | MORE THAN 5 YEARS | EXPERIENCED | 4 - EXPERIENCED WITH DOE | EXPERIENCED-EXPERT | NO | GUIDED | VALIDATION |
| 1 | 10 | 2754218919 | NO | MORE THAN 5 YEARS | EXPERIENCED | 4 - EXPERIENCED WITH DOE | EXPERIENCED-EXPERT | NO | GUIDED | VALIDATION |

Parameter Estimates

| Term | Estimate | Std Error |
|---|---|---|
| Entered Message[Status Quo] | -0.034391983 | 0.1017495942 |
| Heredity Message[Status Quo] | 0.073528037 | 0.1566358221 |
| Heredity Message[Alt 1] | -0.554662275 | 0.1858756896 |
| Hover Help Loc[Confidence Interval] | 0.304350771 | 0.1158762269 |
| Significance Message[Status Quo] | 0.017204022 | 0.1124830418 |
| JMP Experience Level Recoded[Experienced]*Entered Message[Status Quo] | 0.197425171 | 0.1698838881 |
| JMP Experience Level Recoded[Experienced]*Heredity Message[Status Quo] | -0.414208932 | 0.2531417952 |
| JMP Experience Level Recoded[Experienced]*Heredity Message[Alt 1] | -0.304930355 | 0.2717836223 |
| JMP Experience Level Recoded[Experienced]*Hover Help Loc[Confidence Interval] | -0.266980741 | 0.1980285225 |
| JMP Experience Level Recoded[Experienced]*Significance Message[Status Quo] | -0.006700979 | 0.1736912404 |
| DOE Experience Recoded[New-Moderate]*Entered Message[Status Quo] | 0.074300918 | 0.1708876538 |
| DOE Experience Recoded[New-Moderate]*Heredity Message[Status Quo] | -0.476304338 | 0.2589076873 |
| DOE Experience Recoded[New-Moderate]*Heredity Message[Alt 1] | -0.453745085 | 0.2865414126 |
| DOE Experience Recoded[New-Moderate]*Hover Help Loc[Confidence Interval] | -0.304531052 | 0.1988091668 |
| DOE Experience Recoded[New-Moderate]*Significance Message[Status Quo] | 0.006612813 | 0.1778609953 |

| | |
|---|---|
| AICc | 247.84046 |
| BIC | 293.20735 |
| -2*LogLikelihood | 214.98332 |
| -1*Firth LogLikelihood | 156.74836 |

Converged in Gradient
Firth Bias-Adjusted Estimates

Correlation of Estimates

| Corr | Entered Message [Status Quo] | Heredity Message [Status Quo] | Heredity Message [Alt 1] | Hover Help Loc [Confidence Interval] |
|---|---|---|---|---|
| Entered Message[Status Quo] | 1.0000 | 0.0258 | 0.0852 | -0.1423 |
| Heredity Message[Status Quo] | 0.0258 | 1.0000 | -0.2249 | -0.0671 |
| Heredity Message[Alt 1] | 0.0852 | -0.2249 | 1.0000 | -0.1886 |
| Hover Help Loc[Confidence Interval] | -0.1423 | -0.0671 | -0.1886 | 1.0000 |
| Significance Message[Status Quo] | -0.1800 | -0.2423 | -0.1272 | 0.0702 |
| JMP Experience Level Recoded[Experienced]*Entered Message[Status Quo] | 0.0073 | 0.0436 | 0.0181 | -0.0310 |
| JMP Experience Level Recoded[Experienced]*Heredity Message[Status Quo] | 0.0064 | -0.0433 | 0.0358 | -0.0618 |
| JMP Experience Level Recoded[Experienced]*Heredity Message[Alt 1] | -0.0064 | 0.0304 | -0.0298 | 0.0466 |
| JMP Experience Level Recoded[Experienced]*Hover Help Loc[Confidence Interval] | 0.0100 | -0.0272 | 0.0884 | -0.0673 |
| JMP Experience Level Recoded[Experienced]*Significance Message[Status Quo] | -0.1846 | 0.0398 | -0.0725 | 0.0246 |
| DOE Experience Recoded[New-Moderate]*Entered Message[Status Quo] | 0.1339 | -0.0191 | 0.1186 | -0.0180 |
| DOE Experience Recoded[New-Moderate]*Heredity Message[Status Quo] | -0.0545 | -0.0254 | 0.2005 | -0.1022 |
| DOE Experience Recoded[New-Moderate]*Heredity Message[Alt 1] | 0.1110 | 0.2077 | 0.1601 | -0.0229 |
| DOE Experience Recoded[New-Moderate]*Hover Help Loc[Confidence Interval] | 0.0188 | -0.0751 | 0.0218 | -0.0307 |
| DOE Experience Recoded[New-Moderate]*Significance Message[Status Quo] | -0.1542 | -0.0191 | -0.2066 | 0.1213 |

Likelihood Ratio Test

| Source | L-R ChiSq | DF | Prob>ChiSq |
|---|---|---|---|
| Entered Message | 0.107 | 1 | 0.7434 |
| Heredity Message | 11.503 | 2 | 0.0032* |
| Hover Help Loc | 8.415 | 1 | 0.0037* |
| Significance Message | 0.000 | 1 | 1.0000 |
| JMP Experience Level Recoded*Entered Message | 1.758 | 1 | 0.1849 |
| JMP Experience Level Recoded*Heredity Message | 11.347 | 2 | 0.0034* |
| JMP Experience Level Recoded*Hover Help Loc | 2.800 | 1 | 0.0943 |
| JMP Experience Level Recoded*Significance Message | 0.000 | 1 | 1.0000 |
| DOE Experience Recoded*Entered Message | 0.223 | 1 | 0.6369 |
| DOE Experience Recoded*Heredity Message | 16.627 | 2 | 0.0002* |
| DOE Experience Recoded*Hover Help Loc | 3.441 | 1 | 0.0636 |
| DOE Experience Recoded*Significance Message | 0.000 | 1 | 1.0000 |

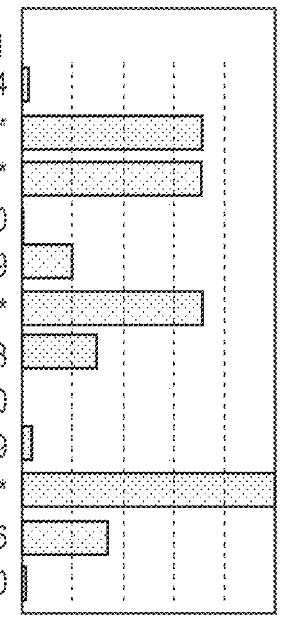

GRAPHICAL USER INTERFACES AND COMPUTING SYSTEMS FOR CONTEXTUAL DISCRETE CHOICE EXPERIMENTS

CROSS-REFERENCE TO RELATED APPLICATIONS

This application claims the benefit of priority based on 35 U.S.C. § 119 to U.S. Provisional Application No. 63/682,934, filed Aug. 14, 2024, the disclosures of which are incorporated herein by reference in their entirety.

BACKGROUND

Scientists can conduct discrete choice experiments in which they ask subjects to select between various options. For example, a software developer can have users interact with different options for software functioning or graphical user interface display and pick their preferred option. A city designer can send out a questionnaire regarding different city construction project options to members of the city who will interact with those projects' options in the questionnaire. A medical team can have their patients participate in different medical procedures and select preferences on those procedures.

A scientist can collect data from a discrete choice experiment to determine a predictive model for the discrete choice experiment. The different options presented to the subject could be represented as profile factors for the predictive model. Information regarding the subjects, such as their demographic characteristics, can also influence how those subjects make their selection, so a predictive model can also capture subject factors. The predictive model can then be used to predict the probability a particular option would be selected given profile factors and subject factors.

SUMMARY

In an example embodiment, a computer-program product tangibly embodied in a non-transitory machine-readable storage medium is provided. The computer-program product includes instructions operable to cause a computing system to obtain multiple factors for a first environment in a first experiment. The multiple factors include one or more profile factors and one or more subject factors. Each profile factor of the one or more profile factors specifies multiple candidate features for the first environment. Each subject factor of the one or more subject factors specifies multiple candidate levels categorizing different subjects interacting with the first environment. The computer-program product includes instructions operable to cause a computing system to obtain a predictive model for predicting probabilities of multiple candidate outcomes for the first environment. The predictive model has weighted model terms representing a contribution of the multiple factors to a given predictive outcome for the predictive model. The computer-program product includes instructions operable to cause the computing system to receive a selection of a first level for a first subject factor of the one or more subject factors. The computer-program product includes instructions operable to cause the computing system to generate a computer-generated representation of a fixed-factor model. The fixed-factor model predicts multiple candidate outcomes for a second environment with subjects defined by the selection of the first level.

In some embodiments, the computer-generated representation is generated from the predictive model without using model training data. A first model term associated with the first subject factor in the predictive model is fixed for the fixed-factor model. The fixed-factor model has at least one model term in common with the predictive model. At least one model term of the fixed-factor model has a respective weight that is adjusted from the predictive model accounting for fixing the first model term.

In another example embodiment, a computing device is provided. The computing device includes, but is not limited to, a processor and memory. The memory contains instructions that when executed by the processor control the computing device to generate a computer-generated representation of a fixed-factor model.

In another example embodiment, a method of generating a computer-generated representation of a fixed-factor model is provided.

Other features and aspects of example embodiments are presented below in the Detailed Description when read in connection with the drawings presented with this application.

BRIEF DESCRIPTION OF THE DRAWINGS

FIGS. 11A-11B illustrate example data for generating a predictive model according to at least one embodiment of the present technology.

FIGS. 12A-12E illustrate graphical user interfaces for generating and analyzing a computer model according to at least one embodiment of the present technology.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed but could have additional operations not included in a figure. A process may correspond to a method, a function, a procedure, a subroutine, a subprogram, etc. When a process corresponds to a function, its termination can correspond to a return of the function to the calling function or the main function.

Systems depicted in some of the figures may be provided in various configurations. In some embodiments, the systems may be configured as a distributed system where one or more components of the system are distributed across one or more networks in a cloud computing system.

Figure 1:
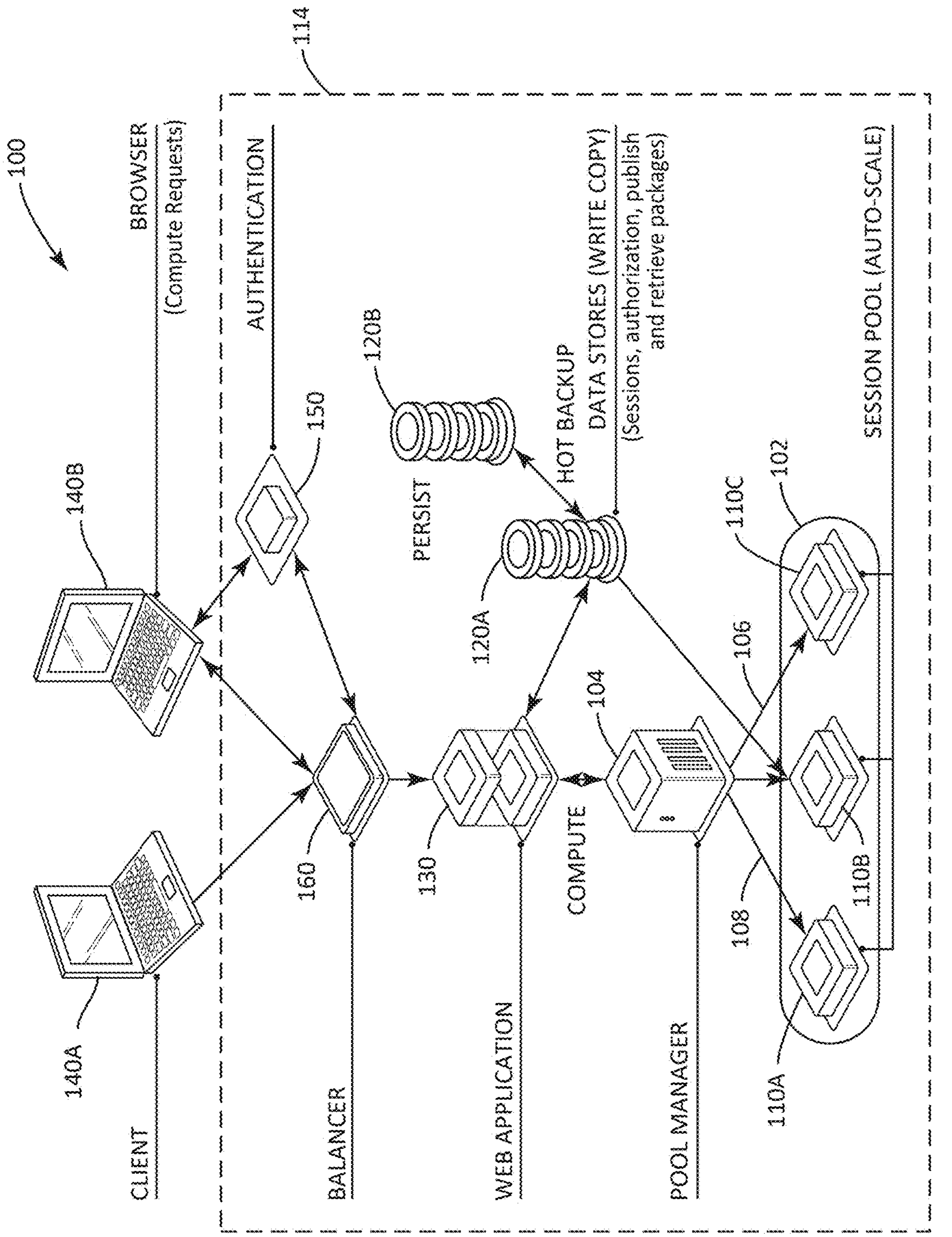
FIG. 1 illustrates an example network, including an example set of devices communicating with each other, according to at least one embodiment of the present technology.

FIG. 1 illustrates an example network 100 including an example set of devices communicating with each other (e.g., over one or more of an exchange system or a network), according to embodiments of the present technology. Network 100 includes network devices configured to communicate with a variety of types of client devices, for example, client devices 140, over a variety of types of communication channels. A client device 140 may be configured to communicate over a public or private network (e.g., client device 140B is configured to support a browser for computing requests or providing authentication).

Network devices and client devices can transmit a communication over a network 100. Network 100 may include one or more of different types of networks, including a wireless network, a wired network, or a combination of a wired and wireless network. Examples of suitable networks include the Internet, a personal area network, a local area network (LAN), a wide area network (WAN), a wireless local area network (WLAN), cloud network, or a cellular network. A wireless network may include a wireless interface or combination of wireless interfaces. As an example, a network in the one or more networks may include a short-range communication channel, such as a Bluetooth or a Bluetooth Low Energy channel. A wired network may include a wired interface. The wired and/or wireless networks may be implemented using routers, access points, base stations, bridges, gateways, or the like, to connect devices in the network. The one or more networks can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS), or other available protocols such as according to an Open Systems Interaction model. In addition, data and/or transactional details may be encrypted. Networks may include other devices for infrastructure for the network. For example, a cloud network may include cloud infrastructure system on demand. As another example, one or more client devices may utilize an Internet of Things (IoT) infrastructure where things (e.g., machines, devices, phones, sensors) can be connected to networks and the data from these things can be collected and processed within the things and/or external to the things. IoT may be implemented with various infrastructure such as for accessibility (technologies that get data and move it), embed-ability (devices with embedded sensors), and IoT services. Industries in the IoT space may include automotive (connected car), manufacturing (connected factory), smart cities, energy and retail.

Network devices and client devices can be different types of devices or components of devices. For example, client device 140 is shown as a laptop and balancer 160 is shown as a processor. Client devices and network devices could be other types of devices or components of other types of devices such as a mobile phone, laptop computer, tablet computer, temperature sensor, motion sensor, and audio sensor. Additionally, or alternatively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, and flow rate sensors. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current. The sensors may be mounted to various components used as part of a variety of different types of systems (e.g., an oil drilling operation). The network devices may detect and record data related to the environment that it monitors, and transmit that data to network 100.

As noted, one type of system that may include various sensors that collect data to be processed and/or transmitted to a computing environment (not shown) according to certain embodiments includes an oil drilling system. For example, the one or more drilling operation sensors may include, for example, surface sensors that measure a standpipe pressure, a surface torque, and a rotation speed of a drill pipe, and downhole sensors that measure a rotation speed of a bit and fluid densities. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration and pump pressure may also be stored and used for modeling, prediction, or classification.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device or client device may include a home automation switch that may be coupled with a home appliance. In another embodiment, a network or client device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment (e.g., computing environment or another computing environment not shown) according to certain embodiments includes a manufacturing environment (e.g., manufacturing products or energy). A variety of different network devices may be included in an energy pool, such as various devices within one or more power plants, energy farms (e.g., wind farm, and solar farm) energy storage facilities, factories, homes and businesses of consumers. One or more of such devices may include one or more sensors that detect energy gain or loss, electrical input or output or loss, and a variety of other efficiencies. These sensors may collect data to inform users of how the energy pool, and individual devices within the pool, may be functioning and how they may be made more efficient. In a manufacturing environment, image data can be taken of the manufacturing process or other readings of manufacturing equipment. For example, in a semiconductor manufacturing environment, images can be used to track, for example, process points (e.g., movement from a bonding site to a packaging site), and process parameters (e.g., bonding force, electrical properties across a bond of an integrated circuit).

Network device sensors may also perform processing on data it collects before transmitting the data to a computing environment, or before deciding whether to transmit data to a computing environment. For example, network devices may determine whether data collected meets certain rules, for example by comparing data or values calculated from the data and comparing that data to one or more thresholds. The network device may use this data and/or comparisons to determine if the data should be transmitted to a computing environment for further use or processing.

Devices in computing environment 114 may include specialized computers, servers, or other machines that are configured to individually and/or collectively process large amounts of data (e.g., using a session pool 102). The computing environment 114 may also include storage devices (e.g., data stores 120) that include one or more databases of structured data, such as data organized in one or more hierarchies, or unstructured data. The databases may communicate with the processing devices within computing environment 114 to distribute data to them and store data used in the computing environment 114. Computing environment 114 may collect, analyze and/or store data from or pertaining to communications, client device operations, client rules, and/or user-associated actions stored at one or more devices in computing environment 114. Such data may influence communication routing to the devices within computing environment 114, and how data is stored or processed within computing environment 114, among other actions.

Network 100 may also include one or more network-attached data stores 120. Network-attached data stores 120 are used to store data to be processed by the computing environment 114 as well as any intermediate or final data generated by the computing system in non-volatile memory. For instance, data stores 120 can perform functions such as writing and copying data and can provide data storage for network functions such as sessions, authorization, publishing and retrieving packages. In certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores 120 may store a variety of different types of data organized in a variety of different ways and from a variety of different sources. For example, network-attached data stores 120 may include storage other than primary storage located within computing environment 114 that is directly accessible by processors located therein. Network-attached data stores 120 may include secondary, tertiary, auxiliary, or back-up storage (e.g., data storage 120B), such as large hard drives, servers, and virtual memory, among other types. Storage devices may include portable or non-portable storage devices, optical storage devices, and various other mediums capable of storing and containing data (e.g., computer a machine-readable storage medium or computer-readable storage medium such as computer readable medium 210 in FIG. 2).

Furthermore, the data stores may hold a variety of different types of data. For example, network-attached data stores 120 may hold unstructured (e.g., raw) data, such as manufacturing data (e.g., a database containing records identifying products being manufactured with parameter data for each product, such as performance metrics or criteria) or product sales databases (e.g., a database containing individual data records identifying details of individual product performance).

The unstructured data may be presented to the computing environment 114 in different forms such as a flat file or a conglomerate of data records and may have data values and accompanying time stamps. The computing environment 114 may be used to analyze the unstructured data in a variety of ways to determine the best way to structure (e.g., hierarchically) that data, such that the structured data is tailored to a type of further analysis on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Other devices can further be used to influence communication routing and/or processing between devices within computing environment 114 and with devices outside of computing environment 114. For example, as shown in FIG. 1, computing environment 114 may include a device 130 supporting a web application. Thus, computing environment 114 can retrieve data of interest, such as client information (e.g., product information, client rules, etc.), technical product details, news, current or predicted weather, and so on. Balancer 160 can be used to balance and direct load within the computing environment 114. Authentication device 150 can be used to provide authentication or other security protocols for a client device, user or group accessing computing environment 114.

In addition to computing environment 114 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from sensors as the sensors continuously sense, monitor and track changes in their environments. Devices within computing environment 114 may also perform pre-analysis on data it receives to determine if the data received should be processed as part of an ongoing project. The data received and collected by computing environment 114, no matter what the source or method or timing of receipt, may be processed over a period of time for a client to determine results data based on the client's needs and rules.

FIG. 1 includes a pool of devices with a pool manager 104 and session pool 102. Network 100 includes a variety of pool managers (e.g., pool manager 104) and worker nodes 110 (e.g., devices, servers, or server farms of session pool 102), according to embodiments of the present technology. Devices of session pool 102 are communicatively connected (e.g., via communication path 108 and communication path 106). Therefore, the pool manager may transmit information (e.g., related to the session pool 102 or notifications), to and receive information from each other. Although only one pool manager 104 is shown in FIG. 1, the network 100 may include more pool managers or a different kind of device manager (e.g., a dedicated resource manager).

Session pool 102 includes one or more worker nodes (e.g., worker node 110A). Shown in FIG. 1 are three worker nodes 110A-C merely for illustration, more or less worker nodes could be present. For instance, the pool manager 104 may itself be a worker node and may not need further worker nodes to complete a task. A given worker node could include dedicated computing resources or allocated computing resources as needed to perform operations as directed by the pool manager 104. The number of worker nodes included in a session pool 102 may be dependent, for example, upon how large the project or data set is being processed by the session pool 102, the capacity of each worker node, and the time designated for the session pool 102 to complete the project. Each worker node within the session pool 102 may be connected (wired or wirelessly, and directly or indirectly) to pool manager 104. Therefore, each worker node may receive information from the pool manager 104 (e.g., an instruction to perform work on a project) and may transmit information to the pool manager 104 (e.g., a result from work performed on a project). Furthermore, worker nodes 110 may communicate with each other (either directly or indirectly). For example, worker nodes 110 may transmit data between each other related to a job being performed or an individual task within a job being performed by that worker node. However, in certain embodiments, worker nodes 110 may not, for example, be connected (communicatively or otherwise) to certain other worker nodes. In an embodiment, worker nodes may only be able to communicate with the pool manager 104 that controls it and may not be able to communicate with other worker nodes in the session pool 102.

The pool manager 104 may connect with other devices of network 100 or an external device (e.g., a pool user, such as a server or computer). For example, a server or computer may connect to pool manager 104 and may transmit a project or job to the node. The project may include a data set. The data set may be of any size. Once the pool manager 104 receives such a project including a large data set, the pool manager 104 may distribute the data set or projects related to the data set to be performed by worker nodes 110. Alternatively, for a project including a large data set, the data set may be received or stored by a machine other than a pool manager 104 or worker node 110 (e.g., a Hadoop data node).

Pool manager may maintain knowledge of the status of the worker nodes 110 in the session pool 102 (i.e., status information), accept work requests from clients, subdivide the work across worker nodes 110, and coordinate the worker nodes 110, among other responsibilities. Worker nodes 110 may accept work requests from a pool manager 104 and provide the pool manager 104 with results of the work performed by the worker nodes 110. A session pool 102 may be started from a single node (e.g., a machine, computer, server, etc.). This first node may be assigned or may start as the primary pool manager 104 that will control any additional nodes that enter the session pool 102.

When a project is submitted for execution (e.g., by a client or a pool manager 104), it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A pool manager may be designated as the primary pool manager among multiple pool managers. A server, computer or other external device may connect to the primary pool manager. Once the pool manager receives a project, the primary pool manager may distribute portions of the project to its worker nodes for execution. For example, when a project is initiated on session pool 102, primary pool manager 104 controls the work to be performed for the project to complete the project as requested or instructed. The primary pool manager may distribute work to the worker nodes 110 based on various factors, such as which subsets or portions of projects may be completed most efficiently and in the correct amount of time. For example, a worker node may perform analysis on a portion of data that is already local (e.g., stored on) the worker node. The primary pool manager also coordinates and processes the results of the work performed by each worker node after each worker node executes and completes its job. For example, the primary pool manager may receive a result from one or more worker nodes, and the pool manager may organize (e.g., collect and assemble) the results received and compile them to produce a complete result for the project received from the end user.

Any remaining pool manager (not shown) may be assigned as backup pool manager for the project. In an embodiment, backup pool manager may not control any portion of the project. Instead, backup pool manager may serve as a backup for the primary pool manager and take over as primary pool manager if the primary pool manager were to fail.

To add another node or machine to the session pool 102, the primary pool manager may open a pair of listening sockets, for example. A socket may be used to accept work requests from clients, and the second socket may be used to accept connections from other pool nodes. The primary pool manager may be provided with a list of other nodes (e.g., other machines, computers, servers) that will participate in the pool, and the role that each node will fill in the pool. Upon startup of the primary pool manager (e.g., the first node on the pool), the primary pool manager may use a network protocol to start the server process on every other node in the session pool 102. Command line parameters, for example, may inform each node of one or more pieces of information, such as: the role that the node will have in the pool, the host name of the primary pool manager, and the port number on which the primary pool manager is accepting connections from peer nodes. The information may also be provided in a configuration file, transmitted over a secure shell tunnel, and recovered from a configuration server. While the other machines in the pool may not initially know about the configuration of the pool, that information may also be sent to each other node by the primary pool manager. Updates of the pool information may also be subsequently sent to those nodes.

For any pool manager other than the primary pool manager added to the pool, the pool manager may open multiple sockets. For example, the first socket may accept work requests from clients, the second socket may accept connections from other pool members, and the third socket may connect (e.g., permanently) to the primary pool manager. When a pool manager (e.g., primary pool manager) receives a connection from another pool manager, it first checks to see if the peer node is in the list of configured nodes in the pool. If it is not on the list, the pool manager may clear the connection. If it is on the list, it may then attempt to authenticate the connection. If authentication is successful, the authenticating node may transmit information to its peer, such as the port number on which a node is listening for connections, the host name of the node, and information about how to authenticate the node, among other information. When a node, such as the new pool manager, receives information about another active node, it will check to see if it already has a connection to that other node. If it does not have a connection to that node, it may then establish a connection to that pool manager.

Any worker node added to the pool may establish a connection to the primary pool manager and any other pool manager on the pool. After establishing the connection, it may authenticate itself to the pool (e.g., any pool manager, including both primary and backup, or a server or user controlling the pool). After successful authentication, the worker node may accept configuration information from the pool manager.

When a node joins a session pool 102 (e.g., when the node is powered on or connected to an existing node on the pool or both), the node is assigned (e.g., by an operating system of the pool) an identifier (e.g., a universally unique identifier (UUID)). This identifier may help other nodes and external entities (devices, users, etc.) to identify the node and distinguish it from other nodes. When a node is connected to the pool, the node may share its identifier with the other nodes in the pool. Since each node may share its identifier, each node may know the identifier of every other node on the pool. Identifiers may also designate a hierarchy of each of the nodes (e.g., backup pool manager) within the pool. For example, the identifiers of each of the backup pool manager may be stored in a list of backup pool manager to indicate an order in which the backup pool manager will take over for a failed primary pool manager to become a new primary pool manager. However, a hierarchy of nodes may also be determined using methods other than using the unique identifiers of the nodes. For example, the hierarchy may be predetermined or may be assigned based on other predetermined factors.

The pool may add new machines at any time (e.g., initiated from any pool manager). Upon adding a new node to the pool, the pool manager may first add the new node to its table of pool nodes. The pool manager may also then notify every other pool manager about the new node. The nodes receiving the notification may acknowledge that they have updated their configuration information.

Primary pool manager 104 may, for example, transmit one or more communications to backup pool manager or other control or worker nodes within the session pool 102). Such communications may be sent using protocols such as periodically, at fixed time intervals, or between known fixed stages of the project's execution. The communications transmitted by primary pool manager 104 may be of varied types and may include a variety of types of information. For example, primary pool manager 104 may transmit snapshots (e.g., status information) of the session pool 102 so that backup pool manager 104 always has a recent snapshot of the session pool 102. The snapshot or pool status may include, for example, the structure of the pool (including, for example, the worker nodes in the pool, unique identifiers of the nodes, or their relationships with the primary pool manager) and the status of a project (including, for example, the status of each worker node's portion of the project). The snapshot may also include analysis or results received from worker nodes in the session pool 102. The backup pool manager may receive and store the backup data received from the primary pool manager. The backup pool manager may transmit a request for such a snapshot (or other information) from the primary pool manager, or the primary pool manager may send such information periodically to the backup pool manager.

As noted, the backup data may allow the backup pool manager to take over as primary pool manager if the primary pool manager fails without requiring the pool to start the project over from scratch. If the primary pool manager fails, the backup pool manager that will take over as primary pool manager may retrieve the most recent version of the snapshot received from the primary pool manager and use the snapshot to continue the project from the stage of the project indicated by the backup data. This may prevent failure of the project as a whole.

A backup pool manager may use various methods to determine that the primary pool manager has failed. In one example of such a method, the primary pool manager may transmit (e.g., periodically) a communication to the backup pool manager that indicates that the primary pool manager is working and has not failed, such as a heartbeat communication. The backup pool manager may determine that the primary pool manager has failed if the backup pool manager has not received a heartbeat communication for a certain predetermined period of time. Alternatively, a backup pool manager may also receive a communication from the primary pool manager itself (before it failed) or from a worker node that the primary pool manager has failed, for example because the primary pool manager has failed to communicate with the worker node.

Different methods may be performed to determine which backup pool manager of a set of backup pool manager will take over for failed primary pool manager 104 and become the new primary pool manager. For example, the new primary pool manager may be chosen based on a ranking or "hierarchy" of backup pool manager based on their unique identifiers. In an alternative embodiment, a backup pool manager may be assigned to be the new primary pool manager by another device in the session pool 102 or from an external device (e.g., a system infrastructure or an end user, such as a server or computer, controlling the session pool 102). In another alternative embodiment, the backup pool manager that takes over as the new primary pool manager may be designated based on bandwidth or other statistics about the session pool 102.

A worker node within the session pool 102 may also fail. If a worker node fails, work being performed by the failed worker node may be redistributed amongst the operational worker nodes. In an alternative embodiment, the primary pool manager may transmit a communication to each of the operable worker nodes still on the session pool 102 that each of the worker nodes should purposefully fail also. After each of the worker nodes fail, they may each retrieve their most recent saved checkpoint of their status and re-start the project from that checkpoint to minimize lost progress on the project being executed.

Figure 2:
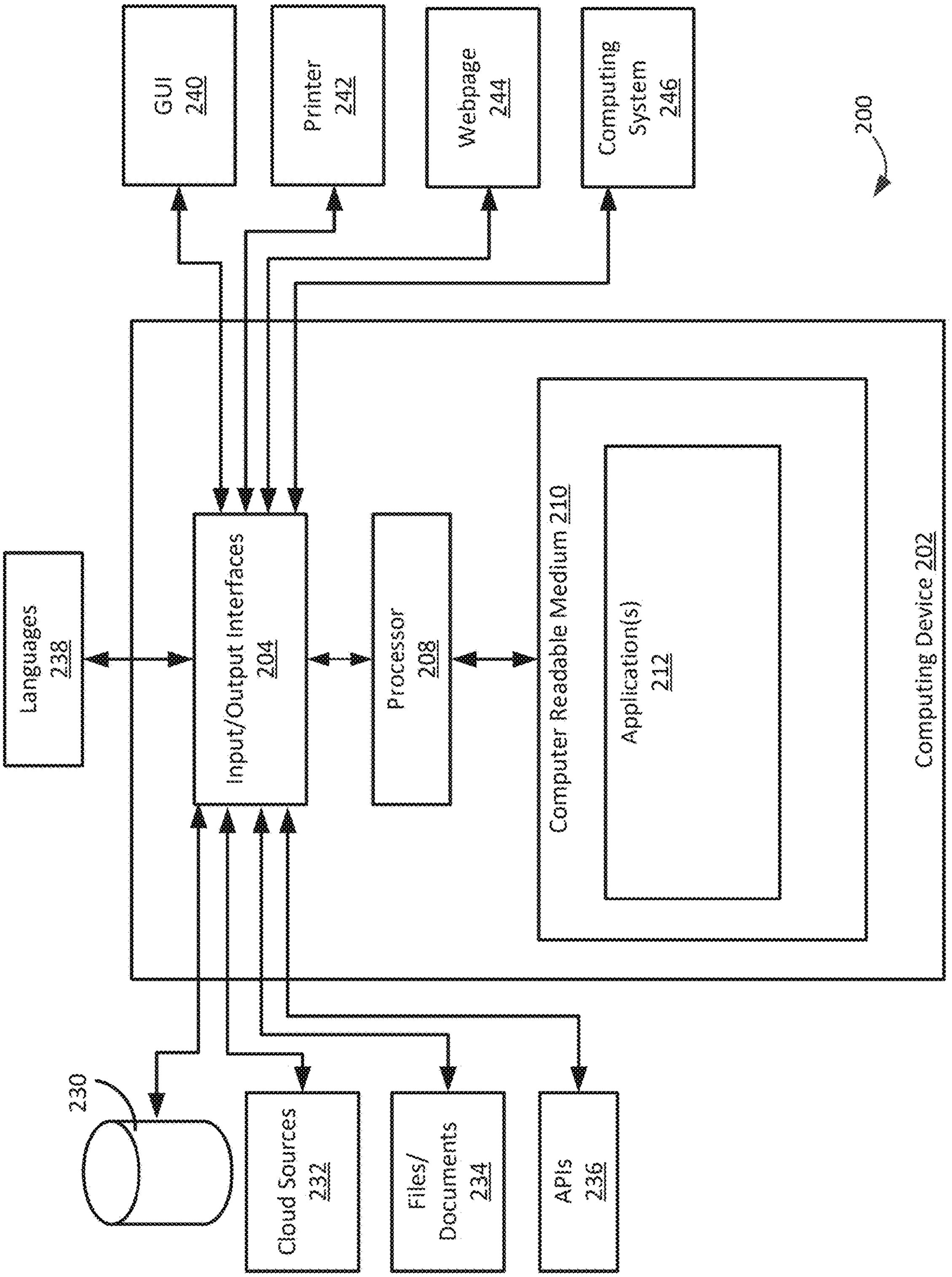
FIG. 2 illustrates a block diagram that provides an illustration of the hardware components of a first computing system according to at least one embodiment of the present technology.

While each device in FIG. 1 is shown as a single device, it will be appreciated that multiple devices may instead be used. FIG. 2 shows an example computing structure for a device in FIG. 2. FIG. 2 includes a computing device 202. The computing device 202 has a computer-readable medium 210 and a processor 208. Computer-readable medium 210 is an electronic holding place or storage for information so the information can be accessed by processor 208. The computer readable medium 210 is a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including, for example, memory sharing, message passing, token passing, and network transmission. Computer-readable medium 210 can include, but is not limited to, any type of random-access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 208 executes instructions (e.g., stored at the computer-readable medium 210). The instructions can be carried out by a special purpose computer, logic circuits, or hardware circuits. In one or more embodiments, processor 208 is implemented in hardware and/or firmware. Processor 208 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 208 in one or more embodiments can retrieve a set of instructions from a permanent memory device and copy the instructions in an executable form to a temporary memory device that is generally some form of RAM, for example. Processor 208 operably couples with components of computing device 202 (e.g., input/output interface 204 and with computer readable medium 210) to receive, to send, and to process information.

For instance, in one or more embodiments, computing device 202 sends and/or receives information from one or more of databases 230, cloud sources 232, application programming interfaces 236 (API's), graphical user interfaces 240 (GUIs), printers 242, webpages 244, and computing systems 246. The input/output interface 204 may be configured to receive languages 238 (e.g., to communicate with other computing systems 246) or specific electronic files or documents 234 (e.g., inputs for building models or designing experiments). The input/output interface 204 may be a single interface (e.g., an output interface only to output reports to a printer 242), multiple interface (e.g., a graphical user interface 240 may be interactive and send and receive data over input/output interface 204), or a set of interfaces (e.g., to connect with multiple devices).

In one or more embodiments, computer-readable medium 210 stores instructions for execution by processor 208. In one or more embodiments, one or more applications stored on computer-readable medium 210 are implemented in software (e.g., computer-readable and/or computer-executable instructions) stored in computer-readable medium 210 and accessible by processor 208 for execution of the instructions.

Figure 3:
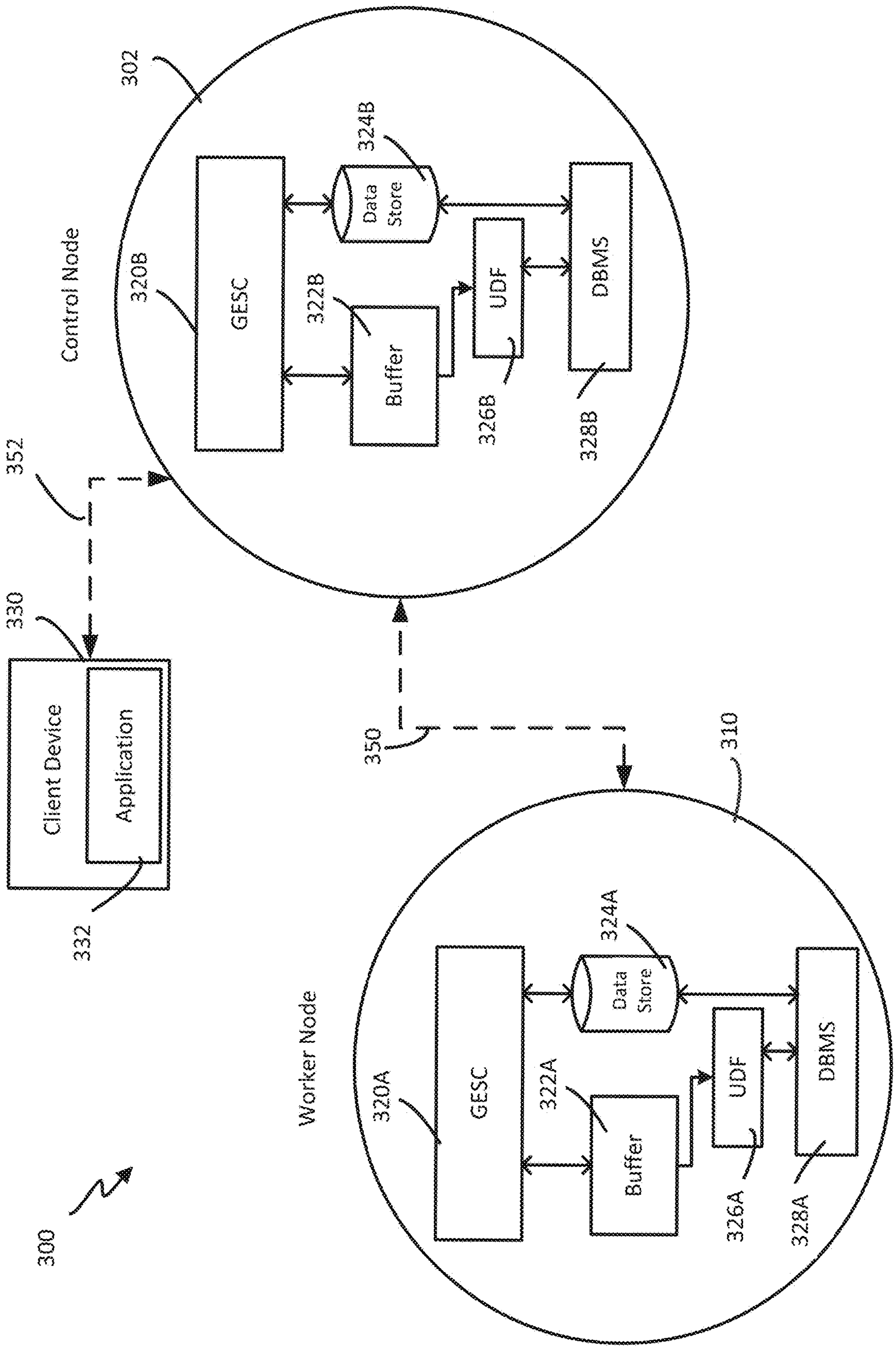
FIG. 3 illustrates a portion of a communications grid first computing system, including a control node and a worker node, according to at least one embodiment of the present technology.

FIG. 3 illustrates a system 300 including a control node (e.g., pool manager 104 of FIG. 1) and a worker node (e.g., worker nodes 110 of FIG. 1), according to embodiments of the present technology. System 300 includes one control node (control node 302) and one worker node (worker node 310) for purposes of illustration but may include more worker and/or control node. The control node 302 is communicatively connected to worker node 310 via communication path 350. Therefore, control node 302 may transmit information (e.g., related to the session pool 102 or notifications), to and receive information from worker node 310 via path 350.

System 300 includes data processing nodes (e.g., control node 302 and worker node 310). Control node 302 and worker node 310 can include multi-core data processors. Each control node 302 and worker node 310 in this example includes a grid-enabled software component (GESC) 320 that executes on the data processor associated with that node and interfaces with buffer memory 322 also associated with that node. Each control node 302 and worker node 310 in this example includes a database management software (DBMS) 328 that executes on a database server (not shown) at control node 302 and on a database server (not shown) at worker node 310.

Each control node 302 and worker node 310 in this example also includes a data storage 324. Data storage 324, similar to network-attached data stores 120 in FIG. 1, are used to store data to be processed by the nodes in the computing environment. Data storage 324 may also store any intermediate or final data generated by the computing system after being processed, for example in non-volatile memory. However, in certain embodiments, the configuration of the system 300 allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the pool receives queries (e.g., ad hoc) from a client device 330 and when responses, which are generated by processing large amounts of data, need to be generated quickly or on-the-fly. In such a situation, the pool may be configured to retain the data within memory so that responses can be generated at different levels of detail and so that a client may interactively query against this information.

Each control node 302 and worker node 310 in this example also includes a user-defined function (UDF) 326. The UDF 326 provides a mechanism for the DBMS 328 to transfer data to or receive data from the database stored in the data storage 324 that are managed by the DBMS. For example, UDF 326 can be invoked by the DBMS 328 to provide data to the GESC 320 for processing. The UDF 326 may establish a socket connection (not shown) with the GESC 320 to transfer the data. Alternatively, the UDF 326 can transfer data to the GESC 320 by writing data to shared memory accessible by both the UDF 326 and the GESC 320.

The GESC 320 at the control node 302 and worker node 310 may be connected via a network. Therefore, control node 302 and worker node 310 can communicate with each other via the network using a predetermined communication protocol such as, for example, the Message Passing Interface (MPI). Each GESC 320 can engage in point-to-point communication with the GESC at another node or in collective communication with multiple GESCs via the network. The GESC 320 at each node may contain identical (or nearly identical) software instructions. Each control node 302 and worker node 310 may be configured to operate as either a pool manager or a worker node. The GESC 320B at the control node 302 can communicate, over a communication path 352, with a client device 330. More specifically, control node 302 may communicate with client application 332 hosted by the client device 330 to receive queries and to respond to those queries after processing large amounts of data.

DBMS 328 may control the creation, maintenance, and use of database or data structure (not shown) within control node 302 and worker node 310. The database may organize data stored in data storage 324. The DBMS 328 at control node 302 may accept requests for data and transfer the appropriate data for the request. With such a process, collections of data may be distributed across multiple physical locations. In this example, each control node 302 and worker node 310 stores a portion of the total data managed by the management system in its associated data storage 324.

Furthermore, the DBMS 328 may be responsible for protecting against data loss using replication techniques. Replication includes providing a backup copy of data stored on one node on one or more other nodes. Therefore, if one node fails, the data from the failed node can be recovered from a replicated copy residing at another node. Data or status information for each node in the session pool 102 may also be shared with each node on the pool.

Figure 4:
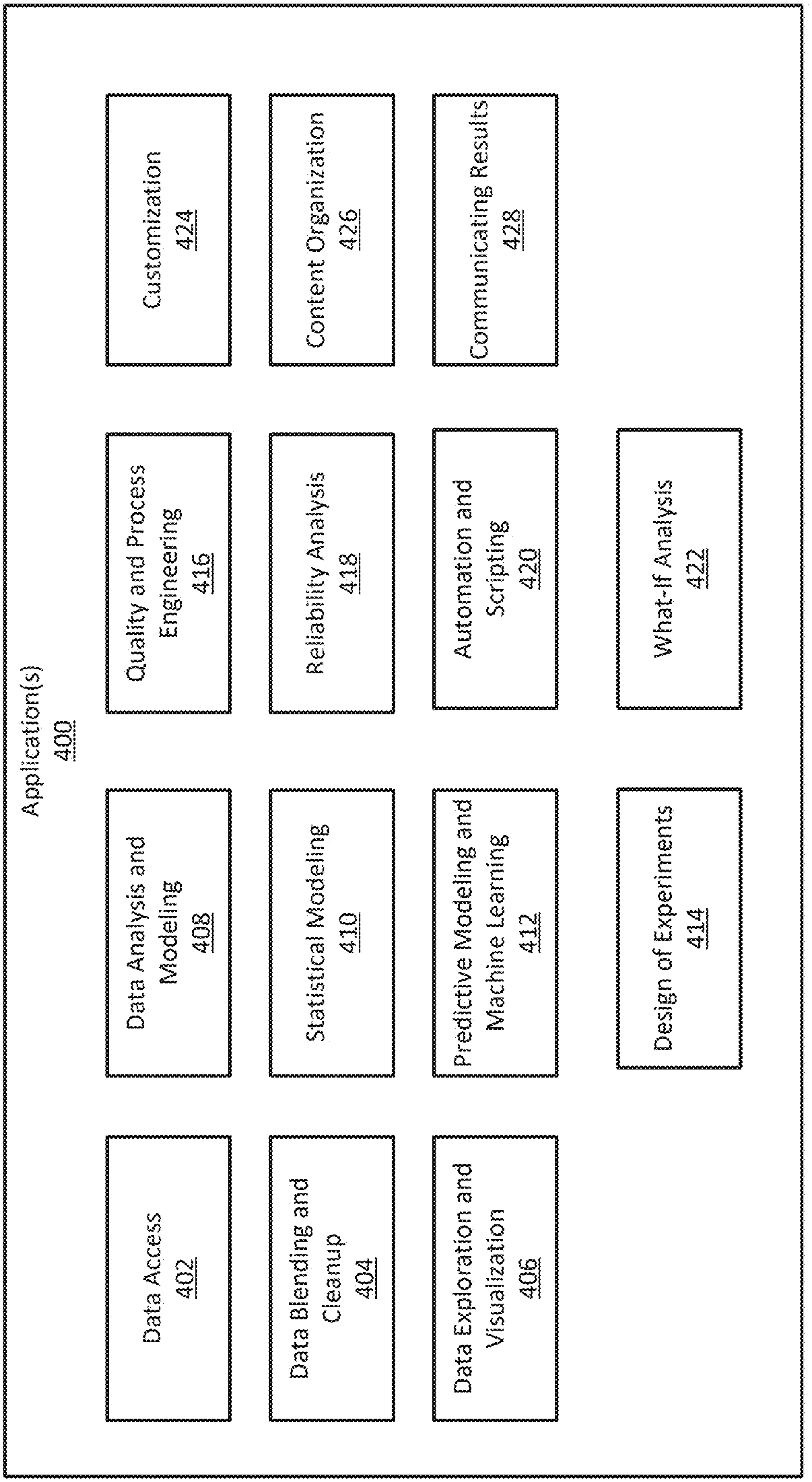
FIG. 4 illustrates a block diagram of example applications according to at least one embodiment of the present technology.

FIG. 4 provides example applications 400 (e.g., applications executed by a computing device 202, worker node 310, or control node 302) for performing one or more tasks or operations.

For example, data access operations 402 can be used for accessing data from different sources (e.g., importing and/or reading Excel files, flat files, relational databases, APIs, R, Python, and SAS® files and databases). For instance, data can be imported for data visualization, exploration and analysis. Data can be formatted or optimized. For instance, data blending and cleanup operations 404 can be used to remove complexity (e.g., in text, images and functions data) and for screening data (e.g., screening data for outliers, entry errors, missing values and other inconsistencies that can compromise data analysis). This can be useful for visual and interactive tools. Data can also be transformed, blended, grouped, filtered, merged into a single table or into subsets, or otherwise arranged for a particular scenario.

In one or more embodiments, one or more applications 400 include data exploration and visualization operations 406 that can be used to support plot and profiler tools. For instance, plot tools can be used to create data plots (e.g., to plot data to spot patterns and patterns that do not fit a trend). Some example plots include bubble plots, scatter plots (matrix and 3D), parallel plots, cell plots, contour plots, ternary plots, and surface plots. Profilers are tools that can be used to create a specialized set of plots in which changing one plot changes the other plots. For instance, profiling is an approach to generate visualizations of response surfaces by seeing what would happen if a user changed just one or two factors at a time. Profiler tools can be used to create interactive profiles of data (e.g., to explore and graph data dynamically and uncover hidden relationships between graphed data or interface with linked data, to interpret and understand the fit of equations to data, and to find factor values to optimize responses). Some example profiler tools include prediction profiler, contour profiler, surface profiler, mixture profiler, custom profiler, and excel profiler. A prediction profiler can be used to show vertical slices across each factor, holding other factors at a current value. A contour profiler allows horizontal slices showing contour lines for two factors at a time. A surface profiler generates three-dimensional plots for two factors at a time, or contour surface plot for 3 factors at a time. A mixture profiler is a contour profiler for mixture of factors. A custom profiler is a numerical optimizer. An excel profiler allows for visualization of models or formulas stored in electronic worksheets. Accordingly, profiler tools can allow for one or more of simulation, surface visualization, optimization, and desirability studies. Graphs (e.g., from plot or profiler tools) can be exported to electronic or print reports for presenting findings. Further, data exploration and visualization operations 406 can include text exploration such as computer extraction of symbols, characters, words and phrases; or computer visualization such as to organize symbols, characters, words and phrases to uncover information regarding a text or classify the text.

In one or more embodiments, one or more applications 400 include data analysis and modeling operations 408 can be used to analyze one or many variables or factors in linked analysis. Analysis results may be linked with specific graphs designed for different types of data or metrics (e.g., graphs related to histograms, regression modeling and distribution fitting). Data analysis and modeling can be performed real-time (or just-in-time). For instance, applications 400 can included statistical modeling operations 410. For instance, statistical modeling operations 410 can be used for a diversity of modeling tasks such as univariate, multivariate and multifactor. Data can be transformed from its collected form (e.g., text or functional form) and data can be used for building models for better insights (e.g., discovery trends or patterns in data). As another example, one or more applications 400 can include predictive modeling and machine learning operations 412 to build models using predictive modeling techniques, such as regression, neural networks and decision trees. The operations 412 can be used to fit multiple predictive models and determine the best performing model with model screening. Validation (e.g., cross-validation and k-fold cross-validation) can be used (e.g., to prevent over-fitting or to select a best model). Machine learning methods can be used by the user without having to write code and tune algorithms. Examples of machine learning techniques are described in more detail with respect to FIGS. 5 and 6).

In one or more embodiments, one or more applications 400 include design of experiments (DOE) operations 414 used to create designs for experiments that provide test conditions for one or more factors tested in the experiment. For example, the design of experiments operations 414 can be used to create optimally designed experiments, efficient experiments to meet constraints, process limitations and budget, and/or screening designs to untangle important effects between multiple factors. DOE operations 414 can also be used for evaluating designs (e.g., design diagnostic measures such as efficiency metrics).

In one or more embodiments, one or more applications 400 include quality and process engineering operations 416 to track and visualize quality and processes. For instance, the quality and process engineering operations 416 can generate charts to explore root causes of quality or process problems (e.g., causes of variation in manufacturing processes and drill down into problem processes). Additionally, or alternatively, they can be used to generate notifications for metrics that exceed a threshold such as an out-of-control signal or a control chart warning. Additionally, or alternatively, they can be used to study the capability and performance of one or more variables to identify processes that are not meeting user-defined goals. Objective data from processes or consumer data can be used to release better products and react to market trends.

In one or more embodiments, one or more applications 400 include reliability analysis operations 418. For example, in manufacturing, reliability analysis tools can be used to prevent failure, improve warranty or product performance, find and address important design vulnerabilities, and pinpoint defects in materials or processes. Reliability analysis tools can also be used to determine how to reduce or improve these issues (e.g., by identifying trends and outliers in data and model predictions). What-if Analysis operations 422 can be used to demonstrate patterns of predicted responses and the effect of each factor on the response with scenario analysis. For example, a graphical user interface can be used for a user to put in different inputs, assumptions or constraints for a system and observe responses or effects. For instance, in a measurement system analysis analyzing whether parts would be in-specification, different estimated variances between parts and operators testing the parts could be varied to determine the effect on modeled output for the measurement system analysis.

In one or more embodiments, one or more applications 400 include automation and scripting operations 420. For example, automation can allow code-free access for a user to automation routines all the way up to completely customized applications (e.g., code free access to SAS®, MATLAB®, Python® and R routines). For example, a design created for experiments can be automated such that automatic testing is performed for the design.

In one or more embodiments, one or more applications 400 include operations for greater user control and interaction. For instance, customization operations 424 can be used for user customization (e.g., mass customizations, and customizations of graphics, statistics, and default views). As another example, content organization operations 426 can be used to organize data (e.g., translate statistical results to a simplified view to communicate findings and organize, summarize, and document content to better aid the accountability and reproducibility of projects). As another example, the communicating results operations 428 can be used for presentation of results, models, or other output from one or more applications 400 (e.g., presented in print, graphical user interface, or web-based versions).

In one or more embodiments, fewer, different, and additional components can be incorporated into computing device 202. In one or more embodiments, the input/output interface has more than one interface that uses the same or different interface technology.

In one or more embodiments, the one or more applications 400 can be integrated with other analytic or computing tools not specifically shown here. For instance, one or more applications are implemented using or integrated with one or more software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML®.

Figure 5:
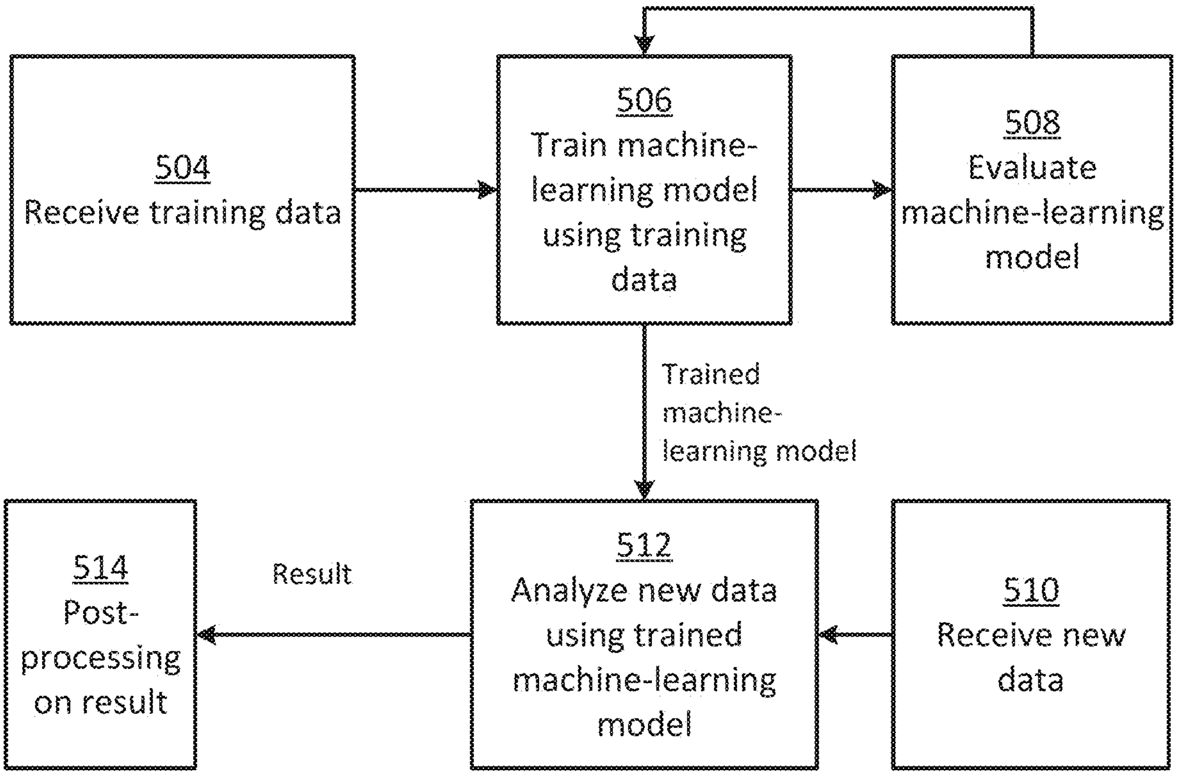
FIG. 5 illustrates a flow chart of an example of a process for generating and using a machine-learning model according to at least one embodiment of the present technology.

One or more embodiments are useful for generating and using machine-learning models. FIG. 5 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector operator (LASSO) classifiers, and support vector machines; (iv) clusterers, such as k-means clustering, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, transformer networks, large language models (LLMs), LLM agents, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, North Carolina.

Machine-learning models construction can be at least partially automated (e.g., with little or no human involvement) in a training process. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 5.

In block 504, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 506, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 508, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 506, where the machine-learning model can be further trained using additional training data or otherwise modified to improve accuracy. If the machine-learning model has an adequate degree of accuracy for the particular task, the process can continue to block 510.

In block 510, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 512, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 514, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 6:
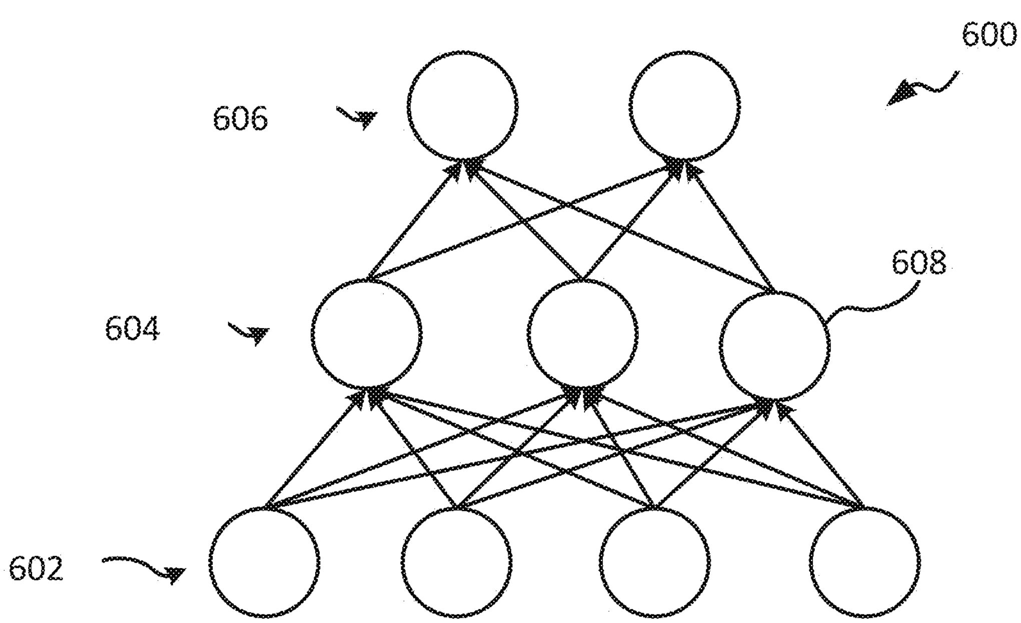
FIG. 6 illustrates an example of a machine-learning model as a neural network according to at least one embodiment of the present technology.

A more specific example of a machine-learning model is the neural network 600 shown in FIG. 6. The neural network 600 is represented as multiple layers of interconnected neurons, such as neuron 608, that can exchange data between one another. The layers include an input layer 602 for receiving input data, a hidden layer 604, and an output layer 606 for providing a result. The hidden layer 604 is referred to as hidden because it may not be directly observable or have its input directly accessible during the normal functioning of the neural network 600. Although the neural network 600 is shown as having a specific number of layers and neurons for exemplary purposes, the neural network 600 can have any number and combination of layers, and each layer can have any number and combination of neurons.

The neurons and connections between the neurons can have numeric weights, which can be tuned during training. For example, training data can be provided to the input layer 602 of the neural network 600, and the neural network 600 can use the training data to tune one or more numeric weights of the neural network 600. In some examples, the neural network 600 can be trained using backpropagation.

Backpropagation can include determining a gradient of a particular numeric weight based on a difference between an actual output of the neural network 600 and a desired output of the neural network 600. Based on the gradient, one or more numeric weights of the neural network 600 can be updated to reduce the difference, thereby increasing the accuracy of the neural network 600. This process can be repeated multiple times to train the neural network 600. For example, this process can be repeated hundreds or thousands of times to train the neural network 600.

In some examples, the neural network 600 is a feed-forward neural network. In a feed-forward neural network, every neuron only propagates an output value to a subsequent layer of the neural network 600. For example, data may only move one direction (forward) from one neuron to the next neuron in a feed-forward neural network.

In other examples, the neural network 600 is a recurrent neural network. A recurrent neural network can include one or more feedback loops, allowing data to propagate in both forward and backward through the neural network 600. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 600 operates by receiving a vector of numbers from one layer; transforming the vector of numbers into a new vector of numbers using a matrix of numeric weights, a nonlinearity, or both; and providing the new vector of numbers to a subsequent layer of the neural network 600. Each subsequent layer of the neural network 600 can repeat this process until the neural network 600 outputs a final result at the output layer 606. For example, the neural network 600 can receive a vector of numbers as an input at the input layer 602. The neural network 600 can multiply the vector of numbers by a matrix of numeric weights to determine a weighted vector. The matrix of numeric weights can be tuned during the training of the neural network 600. The neural network 600 can transform the weighted vector using a nonlinearity, such as a sigmoid tangent or the hyperbolic tangent. In some examples, the nonlinearity can include a rectified linear unit, which can be expressed using the following equation:

$$y = \max(x, 0)$$

where y is the output and x is an input value from the weighted vector. The transformed output can be supplied to a subsequent layer, such as the hidden layer 604, of the neural network 600. The subsequent layer of the neural network 600 can receive the transformed output, multiply the transformed output by a matrix of numeric weights and a nonlinearity, and provide the result to yet another layer of the neural network 600. This process continues until the neural network 600 outputs a final result at the output layer 606.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the session pool 102 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network and/or a transformer model to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. These processors may also be employed in heterogeneous computing architectures with a number of and/or a variety of different types of cores, engines, nodes, and/or layers to achieve various energy efficiencies, processing speed improvements, data communication speed improvements, and/or data efficiency targets and improvements throughout various parts of the system when compared to a homogeneous computing architecture that employs CPUs for general purpose computing.

One or more embodiments are useful for improving graphical user interfaces for designing and conducting discrete choice experiments. In discrete choice experiments which subjects select between various options in the experiment. For example, in a first experiment users can interact with different options in a first environment (e.g., different software functioning or graphical user interface displays) and pick their preferred options. The different options presented to the subject could be represented as profile factors in conducting an experiment. The experiment can also capture information regarding the subjects making selections in the experiment, such as demographic characteristics of the subjects. A predictive model can be used to capture the contribution of factors such as profile factors and subject factors to an outcome in an experiment.

In previous approaches to conducting discrete choice experiments, if a user then wanted to conduct subsequent discrete choice experiments focused on particular subjects (e.g., subjects fixed to a particular demographic), either there would be no predictive model that captures changed model terms for this scenario (e.g., due to the interdependence of variables) or the process would need to be started again to train a new predictive model for designing an experiment with subjects fixed to a particular demographic (e.g., for generating a D-optimal design). Embodiments provide improvements for generating a fixed-factor model in which a characteristic of the subjects is held immutable. When a subject characteristic is held static for the fixed-factor model, model terms can be different than an original predictive model. Embodiments can generate a fixed-factor model representation directly from a predictive model (e.g., without needing to generate training data specific for training a fixed-factor model). Embodiments provide improved computing systems and graphical user interfaces for generating a fixed factor model. This can improve design creation for targeted groups.

Figure 7:
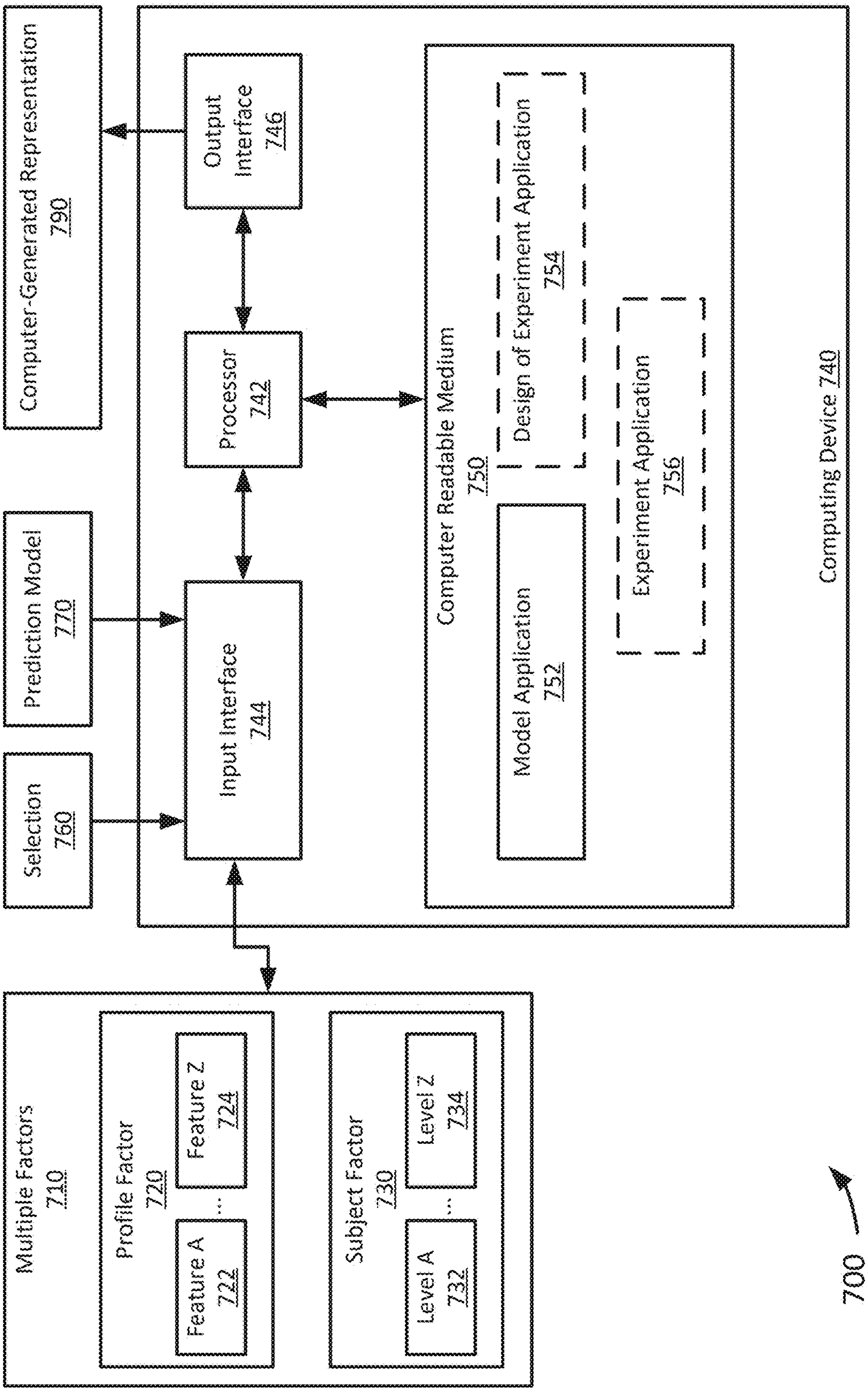
FIG. 7 illustrates a block diagram of a system for generating a representation of a computer model according to at least one embodiment of the present technology.

FIG. 7 illustrates a block diagram of a system 700 for generating a computer-generated representation of a fixed-factor model. In a fixed-factor model a model accounts for a factor that is held static at a particular option for a factor. The fixed-factor model could also be called a static-factor model or an immutable-factor model. System 700 includes a computing device 740. The system 700 is configured to exchange information in the system 700 (e.g., via wired and/or wireless transmission). For example, a network (not shown) can connect one or more devices of system 700 to one or more other devices of system 700. Alternatively, or additionally, the system 700 is integrated into one device (e.g., a touch screen for entry of information and output of computer-generated representation 790).

In one or more embodiments, the computing device 740 includes interfaces to exchange information including input and/or output in the system 700. For example, the computing device 740 includes one or more input interfaces 744 and one or more output interfaces 746. As an example, interface(s) 746 can be used to output a computer-generated representation 790 of a fixed-factor model. For example, the computer-generated representation could be derived parameter estimates for model terms of the fixed-factor model. As another example, the computer-generated representation could be a linear representation with assigned model weights in the linear representation.

Interfaces(s) 746 and interface(s) 744 can be internal or external. For example, the interface(s) 746 can be used to provide the computer-generated representation of a fixed-factor model to a display, or to control hardware and/or software of computing device 740 or an external system (e.g., control according to a design generated based on the computer-generated representation 790 of a fixed-factor model).

In one or more embodiments, interface(s) 744 can obtain information that can be useful for generating the computer-generated representation 790 of a fixed-factor model. For example, interface(s) 744 can obtain multiple factors 710 for an environment in an experiment. These factors can be useful for defining factors of the fixed-factor model. For example, the multiple factors 710 can include one or more profile factors 720. Each profile factor can specify multiple candidate features for the environment (e.g., feature 722 and feature 724). For example, the profile factors 720 can specify multiple candidate features for different objects, different system components, or different systems of an environment. For example, if the environment is a bicycle, the profile factors can specify different options for features of the bicycle such as frame types, brake lever types, saddle types, wheel types, etc. As another example, the environment could be a package delivery environment and the profile factors could describe different systems (e.g., a drone delivery system or a track delivery system). The subject interacts with the different systems by selecting between them (e.g., in a questionnaire about system preferences or in product surveys after using the different systems).

Alternatively, or additionally, the multiple factors 710 can include one or more subject factors 730. Each subject factor can specify multiple candidate levels categorizing different subjects interacting with the first environment (e.g., level 732 and level 734). For example, if the environment is a bicycle, the subject can interact with different objects or system components of the bicycle (e.g., different break levers or saddle types) by selecting between the different objects or system components. The different objects or system components could be embodied as part of the bicycle and a user picks a bicycle with a set of selections (e.g., the user tries out different bicycles with different brake levers or saddle types or is shown images of the different bicycle with different components). Subject factors could be characteristics of those using or selecting the bicycle such as demographic information that describes a sector of a population (e.g., gender or race).

Embodiments described herein include human subjects merely as an example (e.g., a user of bicycle). However, subjects in a population interacting with an environment could be other types of animals or machines. For example, subjects could be animals such as companion, domestic, farm, exotic animals and subject factors can categorize these different animals. For example, if the experiment related to selection amongst dogs between different dog toys, the subject factors categorizing the dogs could relate to their breed, size, or gender. As another example, if the experiment related to selection amongst robots for an experiment involving terrain navigation, the categorization could relate to software or hardware selections for the robots.

The multiple factors 710 could include other types of factors not explicitly shown such as context factors with options specifying different uses for a particular environment (e.g., if the environment is a bicycle, context factors could indicate whether the user intend to use a selected bicycle for trails or streets). One of ordinary skill in the art will appreciate in other examples, there could be only one factor or different combinations of factors such as all profile factors or all subject factors.

In some embodiments, interface(s) 744 can obtain a predictive model 770 for predicting probabilities of multiple candidate outcomes for an environment. The predictive model 770 can be generated by an external device or system not shown or the computing device 740 can obtain a prediction model 770 by receiving a predictive model selection (e.g., for a predictive model generated by computing device 740). The predictive model can be generated using different techniques such as multinomial logistic regression. Regardless of how it was generated, the predictive model 770 has weighted model terms representing a contribution of the multiple factors 710 to a given predictive outcome for the predictive model. In embodiments, the computer-generated representation 790 can be generated from the predictive model without using model training data. In other words, ordinarily to generate a model a computing system generates the model from training data. However, in embodiments, the fixed-factor model need not be trained on training data but rather is determined by computing device 740 from the predictive model. For instance, computing device 740 can make adjustments to representation of the predictive model given a fixed subject factor.

In some embodiments, interface(s) 744 can receive a selection of a level for a subject factor of the subject factors 730. A fixed-factor model can predict multiple candidate outcomes for a second environment with subjects defined by the selection of the first level. A model term associated with the first subject factor in the predictive model can be fixed for the fixed-factor model. The fixed-factor model can have one or more model terms in common with the predictive model, and at least one model term of the fixed-factor model has a respective weight that is adjusted from the predictive model accounting for fixing the first model term.

The computing device 740 has a computer-readable medium 750 and a processor 742 for generating a representation of a fixed-factor model. Computer-readable medium 750 is an electronic holding place or storage for information so the information can be accessed by processor 742. Computer-readable medium 750 can include, but is not limited to, any type of random-access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 742 executes instructions (e.g., stored at the computer-readable medium 750). The instructions can be carried out by a special purpose computer, logic circuits, or hardware circuits. In one or more embodiments, processor 742 is implemented in hardware and/or firmware. Processor 742 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 742 in one or more embodiments can retrieve a set of instructions from a permanent memory device and copy the instructions in an executable form to a temporary memory device that is generally some form of RAM, for example. Processor 742 operably couples with components of computing device 740 (e.g., interface(s) 744, and computer-readable medium 750) to receive, to send, and to process information.

In one or more embodiments, computer-readable medium 750 stores instructions for execution by processor 742. In one or more embodiments, one or more applications stored on computer-readable medium 750 are implemented in software (e.g., computer-readable and/or computer-executable instructions) stored in computer-readable medium 750 and accessible by processor 742 for execution of the instructions.

For example, in one or more embodiments, the computer-readable medium 750 comprises instructions for model application 752 to generate a computer-generated representation 790 of a fixed-factor model (e.g., based on prediction model 770). The computer-readable medium 750 can also include instructions for design of experiment application 754 for generating a design for an experiment. For example, the design can be for a second experiment subsequent to a first experiment for generating a predictive model. The design can be based on the computer-generated representation 790. Alternatively, or additionally, the computer-readable medium 750 can include an experiment application 756 for controlling an experiment based on the computer-generated representation 790 (e.g., a design based on the computer-generated representation 790). For example, the experiment application 756 can be used to control or generate an environment to collect data to generate a computer model and/or generate an environment in an experiment with a fixed factor of the computer model.

Environments for generating a predictive model and for conducting a fixed subject experiment can be the same environment or different. For instance, if a tested environment is a robot, the same robot could be used for each of different experiments (e.g., all of the profile factors could be the same because the robot would have the same features). Alternatively, a different robot could be used (e.g., one with less than all of the profile factors or factor features of the first robot or additional profile factors or features). As an example, perhaps the robot had two operation modes that are profile factors in a first experiment, but then when a subject factor is held static in a subsequent experiment, the robot could only operate in one operation mode removing that as a profile factor or it could have additional operating modes.

In one or more embodiments, fewer, different, and additional components can be incorporated into computing device 740. For instance, in one or more embodiments, there are one or more devices or computing systems (e.g., for providing input to interface(s) 744 or receiving output from interface(s) 746. As another example, the same interface supports both input interface(s) 744 and output interface(s) 746. For example, a touch screen provides a mechanism for user input and for presentation of output to the user. Alternatively, the input interface(s) 744 has more than one input interface that uses the same or different interface technology. Alternatively, or additionally, the output interface(s) 746 has more than one output interface that uses the same or different interface technology.

The one or more applications in computer-readable medium 750 can be integrated with other analytic tools. As an example, model application 752 can be integrated with data analytics software application and/or software architecture such as that offered by SAS Institute Inc. or JMP Statistical Discovery LLC of Cary, N.C., USA or other companies. Merely for illustration, the applications are implemented using or integrated with one or more software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML®. For instance, JMP® can be used to generate a computer model and generate a design from a computer model.

One or more applications stored on computer-readable medium 750 can be implemented as a Web application. For example, an application can be configured to receive hypertext transport protocol (HTTP) responses and to send HTTP requests. The HTTP responses may include web pages such as hypertext markup language (HTML) documents and linked objects generated in response to the HTTP requests.

Each web page may be identified by a uniform resource locator (URL) that includes the location or address of the computing device that contains the resource to be accessed in addition to the location of the resource on that computing device. The type of file or resource depends on the Internet application protocol such as the file transfer protocol, HTTP, H.323, etc. The file accessed may be a simple text file, an image file, an audio file, a video file, an executable, a common gateway interface application, a Java applet, an extensible markup language (XML) file, or any other type of file supported by HTTP.

Embodiments enable a user to generate a fixed-factor model from a predictive model, which can be useful for designing or controlling an experiment for a particular subject group.

Figure 8:
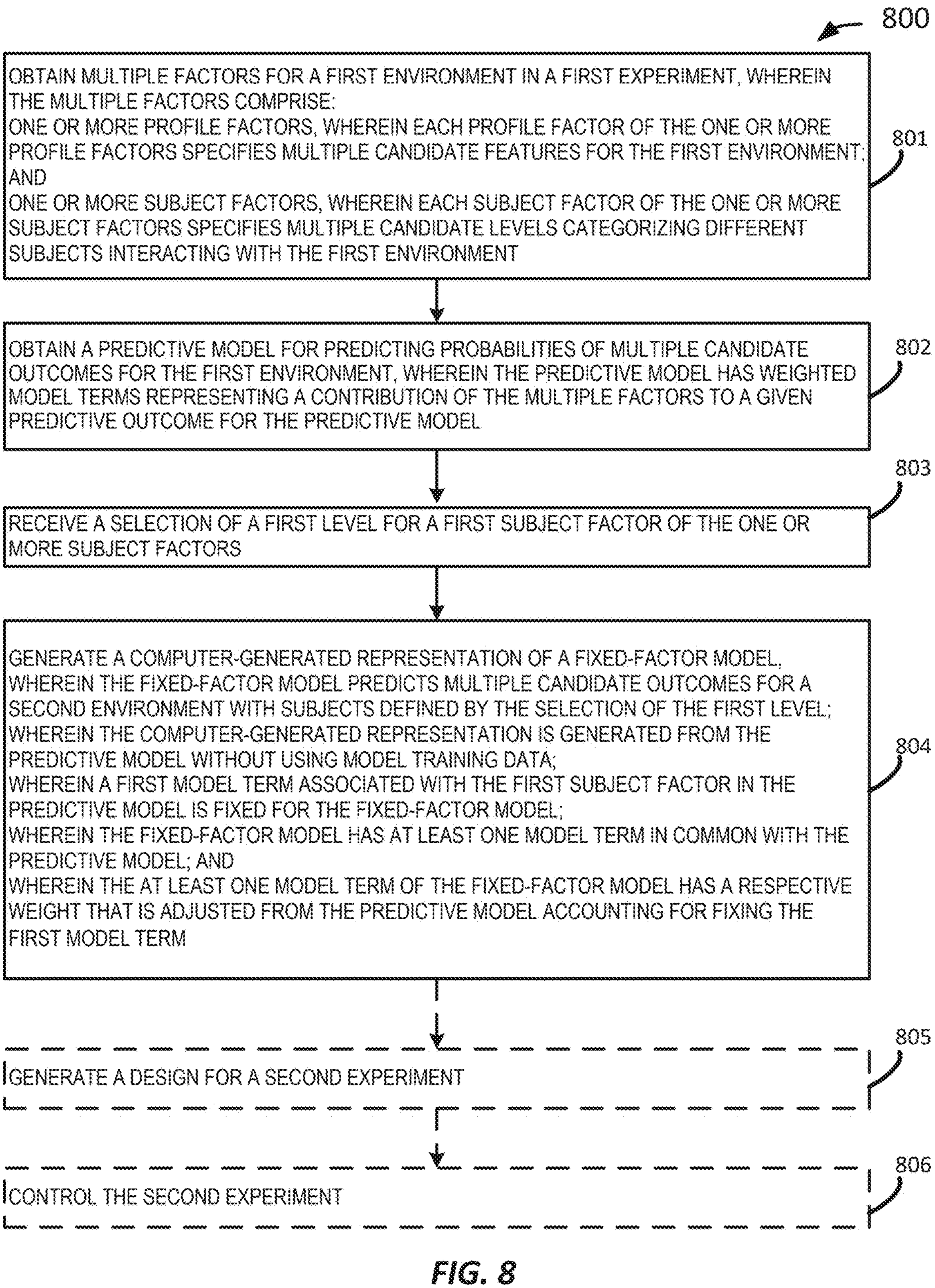
FIG. 8 illustrates a flow diagram for generating a representation of a computer model according to at least one embodiment of the present technology.

FIG. 8 illustrates a flow diagram for generating a representation of a computer model (e.g., computer-generated representation 790 of FIG. 7). Embodiments described herein, including the method depicted in FIG. 8, can be implemented by a computing system (e.g., system 700 or computing device 740 of FIG. 7).

Figure 9A:
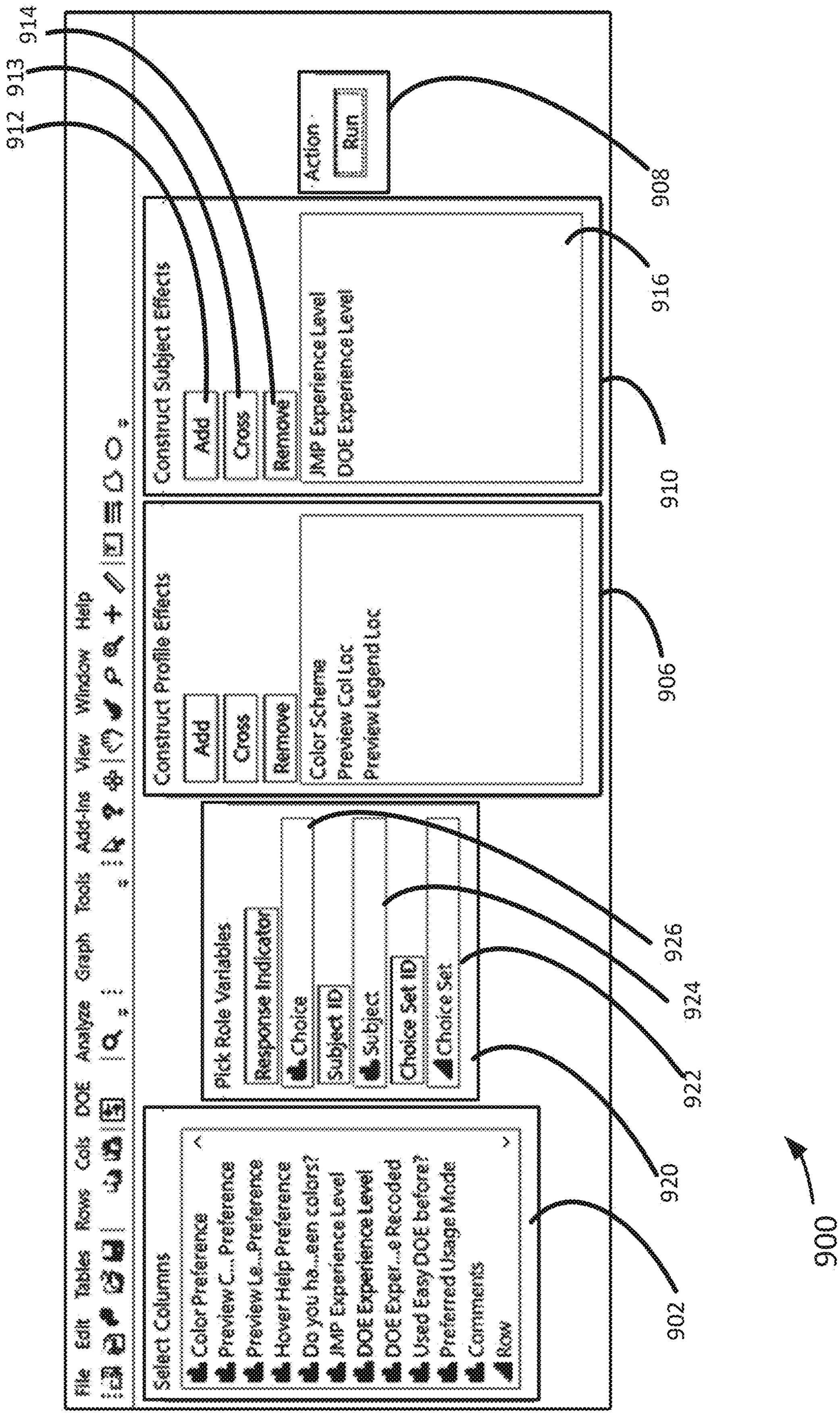
FIGS. 9A-9D illustrate graphical user interfaces for generating a representation of a computer model according to at least one embodiment of the present technology.

The method 800 includes an operation 801 for obtaining multiple factors for a first environment in a first experiment. For example, the operation 801 could include receiving the multiple factors from user input or from an external system. FIG. 9A shows an example of a graphical user interface for receiving user input of profile factors and their respective candidate features and subject factors and their respective levels. As another example, the operation 801 could include obtaining the multiple factors by receiving a selection of predefined or prestored factors.

In this example the multiple factors can include one or more profile factors. Each profile factor of the one or more profile factors specifies multiple candidate features for the first environment. For example, if the environment is a restaurant with an experiment related to choices between appetizers, a profile factor could relate to seating choices with different options specifying bar stool, booth, and table seating which can have an influence on user appetizer choice. Further the multiple factors can include one or more subject factors. Each subject factor of the one or more subject factors specifies multiple candidate levels categorizing different subjects interacting with the first environment (e.g., age, education level, marital status, medical diagnosis can also influence user choice). Additionally, the multiple factors could include other types of factors such as context factors with options specifying different uses (for example is the restaurant goer in a business meeting or on a date). One of ordinary skill in the art will appreciate in other examples, there could be only one factor, or different combinations of factors, then specifically shown in operation 801 such as all profile factors or all subject factors.

The method 800 includes an operation 802 for obtaining a predictive model for predicting probabilities of multiple candidate outcomes for the first environment. The predictive model has weighted model terms representing a contribution of the multiple factors to a given predictive outcome for the predictive model. For example, obtaining a predictive model could include generating a predictive model by a computing system (e.g., from training data). As another example, obtaining a predictive model could include receiving the predictive model or a representation of the predictive model from an external computing system.

The method 800 includes an operation 803 for receiving a selection of a first level for a first subject factor of the one or more subject factors. For example, the first subject factor could be a demographic factor (e.g., race or gender), and the selection is of a particular demographic option such as (Asian or female). The selection could be based on user input. The selection could be computer-generated. For example, the computing system could select one or more subject factors determined to be most impactful in the predictive model or determined based on a database query of participant characteristics for a follow-up experiment. FIG. 9C shows an example graphical user interface for receiving a selection of the first level for the first subject factor.

The method 800 includes an operation 804 for generating a computer-generated representation of a fixed-factor model. The fixed-factor model predicts multiple candidate outcomes for a second environment for a second experiment with subjects defined by the selection of the first level. The computer-generated representation is generated from the predictive model without using model training data. In this example, the at least one model term of the fixed-factor model has a respective weight that is adjusted from the predictive model accounting for fixing the first model term. For instance, in models where factors have interactions between them, fixing a first model term can change the contribution of other non-fixed factors. Claimed embodiments can determine adjustment to respective weight to take into account the changes to contribution of remaining factors without having to generate the fixed-factor model using model training data.

In this example, a first model term associated with the first subject factor in the predictive model is fixed for the fixed-factor model. The fixed-factor model has at least one model term in common with the predictive model. In some embodiments all the model terms remain the same. In other examples, additional or less factors can be present in the fixed-factor model. For example, subsequent experimentation could focus on fewer experimental variables, and a fixed-factor model for determining a design could have fewer factors. As another example, additional subject factors could be added to add additional distinction between subject participants narrowed as defined by the fixed factor. Factors present in both the predictive model and fixed-factor model could also have different options or levels. For example, a design for the fixed-factor model could have less options available to focus further experimentation or more important factors under the predictive model. As another example, levels could be consolidated or expanded. For example, if a subject factor for a predictive model related to years of experience with an environment the level could have three or more age ranges, and a subject factor in the fixed-factor model could instead have only two age ranges. As another example, if the options relate to different filter sizes for a filter profile factor, the options could have different granularity in option sizes.

Operations described herein could have multiple operations or be combined into a single operation. Further, the method 800 can include more or fewer operations. For example, the method 800 can include an optional operation 805 to generate a design for a second experiment. For instance, the representation of the fixed-factor model can be used to generate a design for conducting a second experiment. Designs can be optimized based on the fixed-factor model (e.g., to create orthogonal designs, or G, D, A, or I-optimal designs). A G-optimal design minimizes the maximum prediction variance for a given model. A D-optimal design minimizes the volume of a confidence ellipsoid about the parameter estimates. An A-optimal design minimizes the average variance of the main effects. An I-optimal design minimizes the average variance of prediction. For instance, the generated design can be D-optimal and assessed with a D-efficiency metric, which is the efficiency of the design to that of an ideal or hypothetical orthogonal design in terms of a D-optimality criterion.

The method 800 includes an optional operation 806 to control the second experiment. In one or more embodiments, the second experiment can be controlled by the computing system. For example, if the second experiment is related to different graphical user interface the computing system can present the different graphical user interface (e.g., according to a generated design). As another example, if the second experiment is related to a machine, the computing system can provide inputs to the machine to control it (e.g., in accordance with a generated design). The method 800 can be conducted using graphical user interface described herein.

FIGS. 9A-9D illustrate graphical user interfaces for generating a computer-generated representation of a model. FIG. 9A illustrates a graphical user interface 900 for obtaining factors for a computer-generated model (e.g., a predictive model). Select element 902 allows a user to indicate to a computing system a selection of columns of data (e.g., that have features or options for a particular factor) for adding as profile factors or subject factors for a computer model. Subject element 910 allows a user to add or remove a selected column to a subject factor list. For example, selecting a column "DOE Experience Level" in select element 902 and selecting add control 912 has added it to the subject factors displayed in portion 916 of subject element 910. The user could select a factor from portion 916 and use the remove control 914 to remove it. Other options can be used for controlling factors. For instance, cross control 913 allows factors to be denoted as crossed in that each level of one factor is tested with another level of another crossed factor. The subject factors in this example specify demographic information of users of the software tool interacting with the display, but graphical user interface 900 could be used for other environments or experiments.

In one or more embodiments, subject factors can be predefined. For example, semantic classification can be used to extract demographic related factors. Alternatively, or additionally, data could be synthetic data, and subject factors are predefined for the synthetic data (e.g., synthesizing men and women subjects). The graphical user interface 900 can display the predefined subject factors and a computing system can receive a selection of the predefined subject factors. For example, the user can optionally use remove control 914 to remove unwanted factors or add additional factors and a computing system can receive the selection of subject factors when the user selects the run control 908 (e.g., to generate a predictive model).

Graphical user interface 900 also includes profile element 906 to allow a user to add or remove a selected column to a profile factor list. The profile factors in this example specify features for the display in the software environment. For instance, the user has selected profile factors related to a graphical user interface display such as color scheme, preview column location, and preview legend location. Profile factors can be added, removed, or crossed using techniques described with respect to subject factors.

Role element 920 allows a user to select data for other purposes for experimentation such as response indicator type, a subject identifier, and a choice set identifier. For example, the response indicator element 926 shows "choice" because the model for generation is applicable to a discrete choice experiment. Subject identifier element 924 specifies the "subject" column which can include subject identifying information like an id number, a subject name, etc. Choice set identifier element 922 identifies the data column with identifiers for the configurations for the choice sets.

In one or more embodiments, a computing system receives a generated model, and graphical user interface 900 can be used to visualize aspects of the model. For example, the computing system can obtain factors for the model by extracting factors from model terms and displaying in the graphical user interface 900 the extracted factors. The user can generate an updated model by selecting one or more profile factors from extracted factors.

Figure 9B:
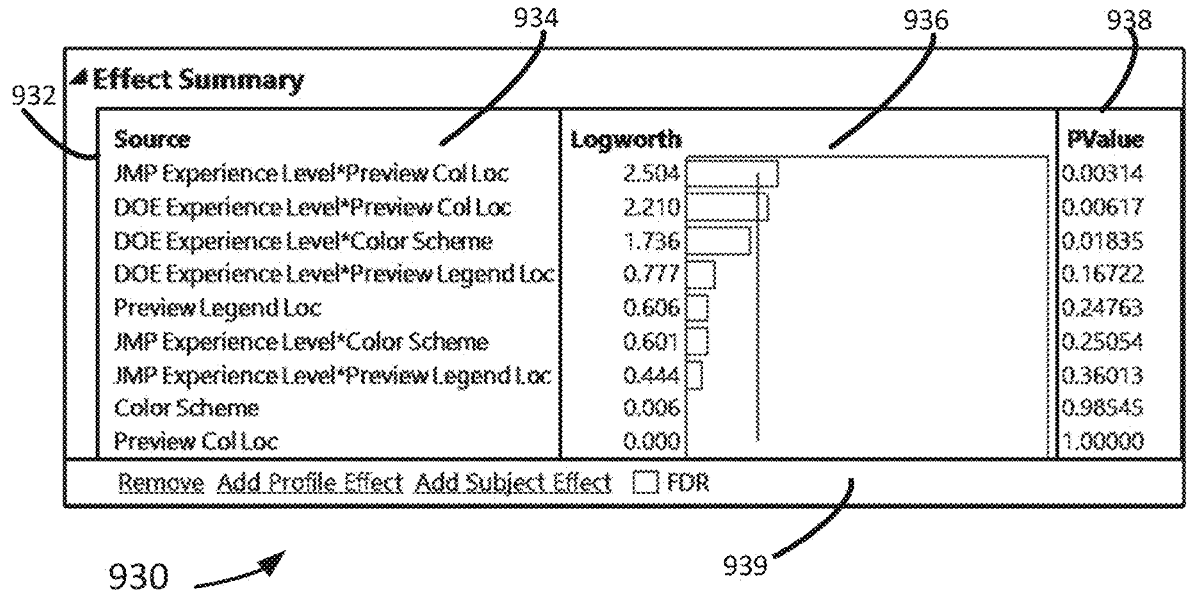
Figure 9C:
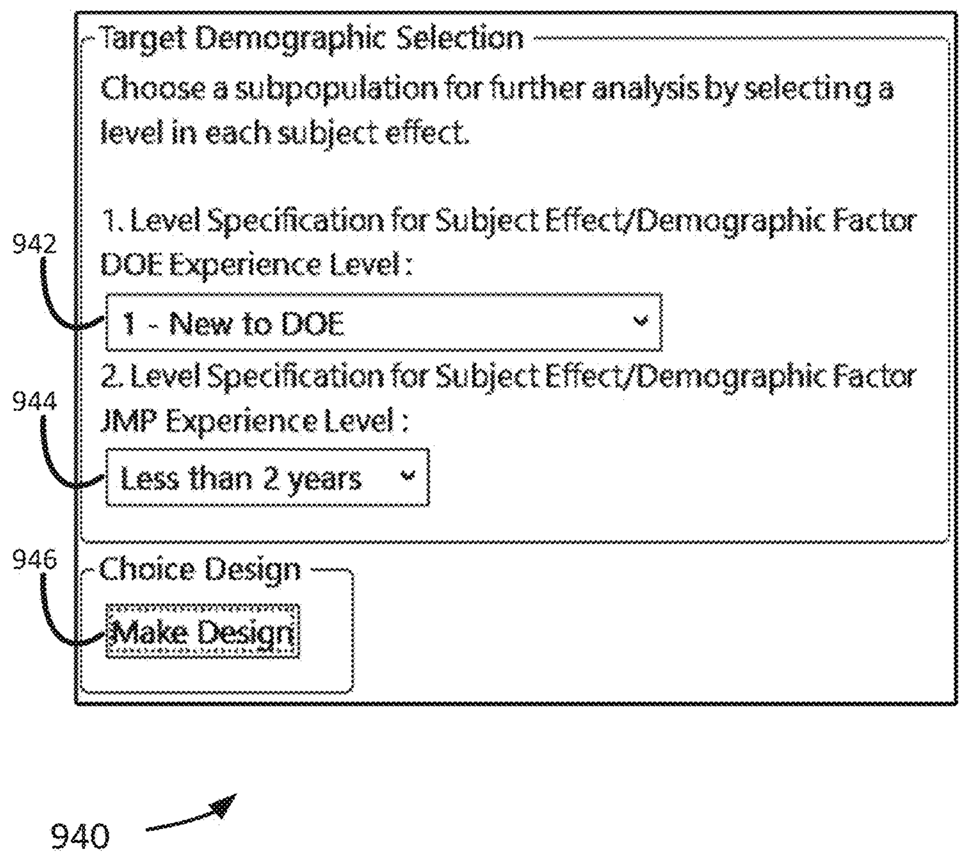

FIG. 9B illustrates a graphical user interface 930 representing a computer-generated model. In this example, an effects summary table 932 shows the model terms of a model in model column 934. As shown the model terms in this example include profile factors (e.g., "Color Scheme" and "Preview Col Loc") and subject factors (e.g., DOE Experience Level") selected in graphical user interface 900 and their interactions (e.g., "DOE Experience Level*Color Scheme"). Graphical user interface 930 can further display information for the user to evaluate or adjust model terms. For example, effects summary table 932 provides logworth values in logworth chart 936 and p-values in Pvalue column 938. A user can further adjust the model selecting model terms to remove or add further profile or subject terms using model controls 939 in graphical user interface 930. For example, a user could remove interaction model terms or model terms with a pvalue less than a threshold that may not have as much significance to the model (e.g., model terms with a pvalue <0.05). Model controls 939 in this example also include controls for adjusting a p-value to ensure a false discovery rate (FDR). Once a utility model is finalized graphical user interfaces can be used to produce representations of a fixed-factor model for particular subject factors of the utility model.

FIG. 9C illustrates a graphical user interface 940 representing selection of a particular level for a fixed-factor model for each of the specified subject factors in subject element 910 in FIG. 9A. A computing system can obtain a selection of a subject by displaying one or more subject factors and their respective levels. In this example, where a computing system has received multiple subject factors, a user can select a level for each factor using control 942 and control 944 (e.g., selecting drop-down options). In some embodiments, there could be more or less controls. For instance, the graphical user interface 940 may allow a user to select a particular subject as well as a particular level for that subject (e.g., in situations were less than all subject factors are fixed).

Multiple different fixed-factor models can be represented (e.g., by making different selections and selecting control 946 to generate a design). For instance, a computing system can generate a first fixed-factor model with respect to the selection of the first level (e.g., "New to DOE") for a first subject factor (e.g., "DOE Experience Level"). The computing system can receive a selection of a second level and generate a second fixed-factor model with respect to the selection of the second level. For instance, the second level can be a different level for the first subject factor from the first level (e.g., the user makes a different selection such as changing "New to DOE" to "Experience with DOE" for "DOE Experience Level). Alternatively, the second level pertains to a second subject factor (e.g., changing control 944).

In one or more embodiments, a computing system obtains a selection of a level by assessing a relevance of subject factor(s) to a predictive model or displaying in a graphical user interface a computer-generated assessment of the one or more subject factors to the relevance of the predictive model. For example, the default subjects and/or levels shown can be selected by a computing system as ones more relevant to the predictive model and shown in an initial position in graphical user interface 940. Alternatively, or additionally, a computing system can limit options presented to the user to those that are more relevant to the predictive model. Alternatively, or additionally, a computing system can automatically select a level (e.g., based on the relevance to a model) without displaying a graphical user interface like graphical user interface 940.

In one or more embodiments, a computing system can use different classification of levels between experiments. For instance, if the experience level in the first experience were recorded as a specific year, classifications for the targeted year can be binned into year ranges or classified as a particular experience level such as new with moderate experience. Accordingly, there can be a different quantity of candidate levels shown for a factor for a targeted demographic experience and the computing system can receive the selection of a level by selecting a level classified according to the targeted selection.

Figure 9D:
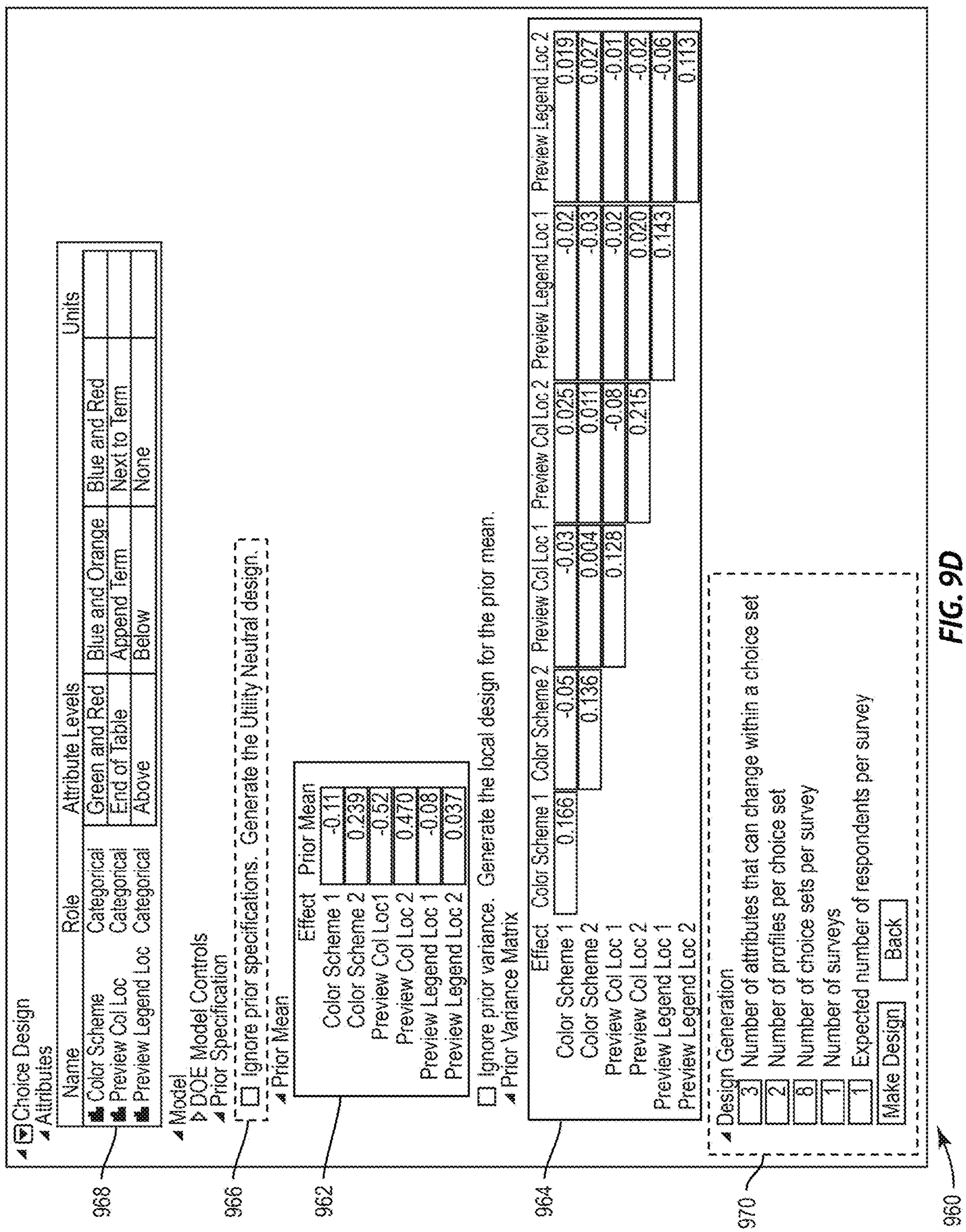

A computing system can generate data representing means and variances for profile factors for a fixed-factor model based on a predictive model. FIG. 9D shows a graphical user interface 960 displaying computer-generated representations for a fixed-factor model with model terms related to the attributes in attributes table 968. In this example, the attributes are related to the profile factors without specifying subject factors because the subject factors shown in FIG. 9A are held fixed at a particular level in FIG. 9D. In this example, the profile factors were categorical, and the categorical options are shown in attributes table 968. Different information pertaining to the factors could be displayed in other examples (e.g., units) if the factors had numerical levels. In some examples other types of factors could be displayed (e.g., subject factors allowed to change, and context factors).

The computing system in this example updates means and variances accounting for the selection of particular levels for subject factors (e.g., selection shown in FIG. 9C). Graphical user interface 960 displays computer-generated representation for a fixed-factor model in accordance with the updated means in mean table 962 and updated variances in variance matrix 964. The user can review these representations in the graphical user interface 960 and make any adjustments before generating a design. For instance, the means and variances can be interactive text boxes for user adjustment. Alternatively, or additionally, the user can ignore the generated specifications and return to a utility neutral design as shown in control 966.

The display shown in graphical user interface 960 is just one example of a computer representation of a computer model. Other types of representations could be made, or representations could be referred to differently. For instance, in this example, the model is represented with "prior" specification for "prior" mean and "prior" variances because in Bayesian statistics a "prior" is an assumption before data is collected. These labels underscore an advantage of embodiments that information about a model can be generated without needing to observe data to generate that model. These generated assumptions can be helpful for generating a design for an experiment using design generation controls in section 970 of graphical user interface 960.

Embodiments enable a user to set up the follow-up experiment according to the fixed-factor model directly in the graphical user interface. For instance, in section 970 the user can adjust features of the design such as the number of attributes that can change within a choice set, number of profiles per choice set, number of choice sets per survey, number of surveys, and expected number of respondents per survey. For instance, the user has selected "2" as the number of profiles per choice set and "8" as the number of choice sets per survey which can mean that during an experiment for selecting the best profile for an interface, the user is presented with 2 example interface to pick between per question and there will be 8 questions or 16 configurations presented to a user as part of a survey.

Figure 10A:
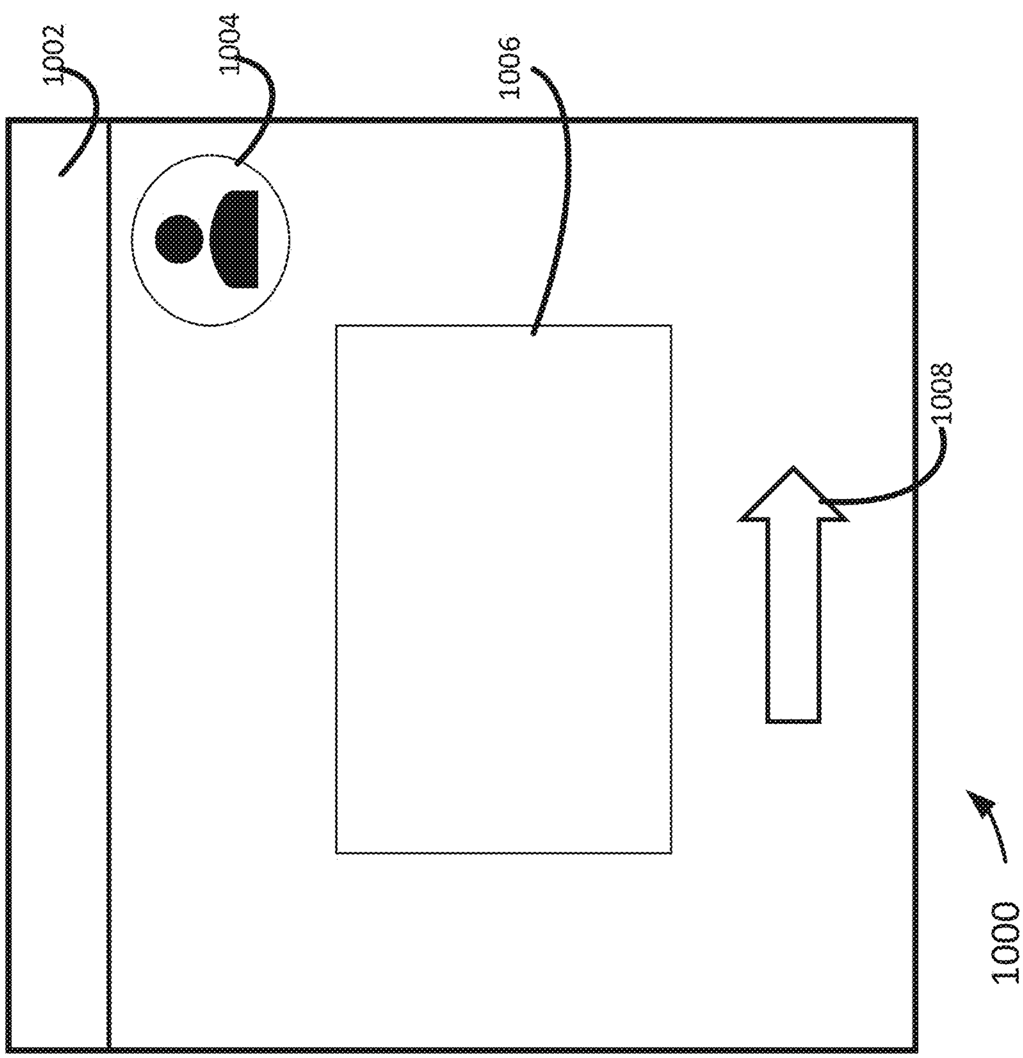
FIGS. 10A-10B illustrate an example environment for an experiment design according to at least one embodiment of the present technology.
Figure 10B:
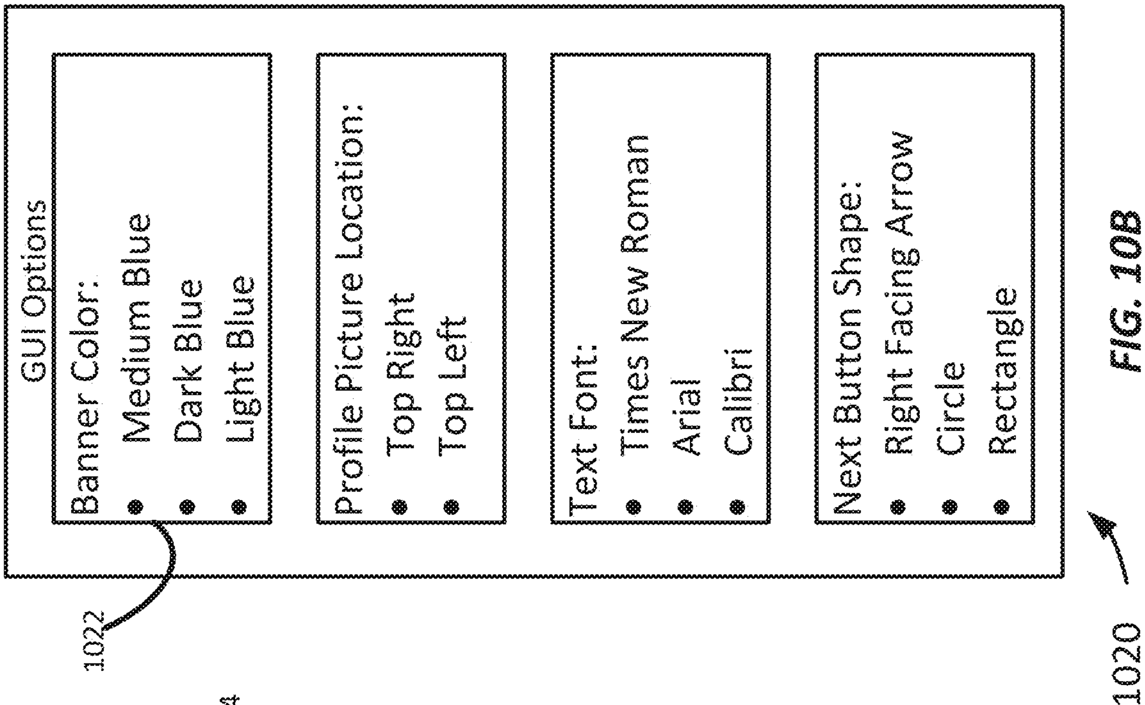

FIGS. 10A-10B illustrate example environment for an experiment design related to an interface experiment. FIG. 10A shows an environment 1000 for a first experiment. The environment 1000 is a graphical user interface environment. FIG. 10B shows example profile factors in graphical user interface options 1020 for the environment 1000. For instance, environment 1000 has a banner 1002 and banner factor 1022 has options of color for that banner including light, medium and dark blue. In the experiment the different options can be displayed to the user with different configurations for the other profile factors (e.g., the location of profile picture 1004, the text font in text box 1006 and the button 1008) according to the graphical user interface options 1020.

Figure 10C:
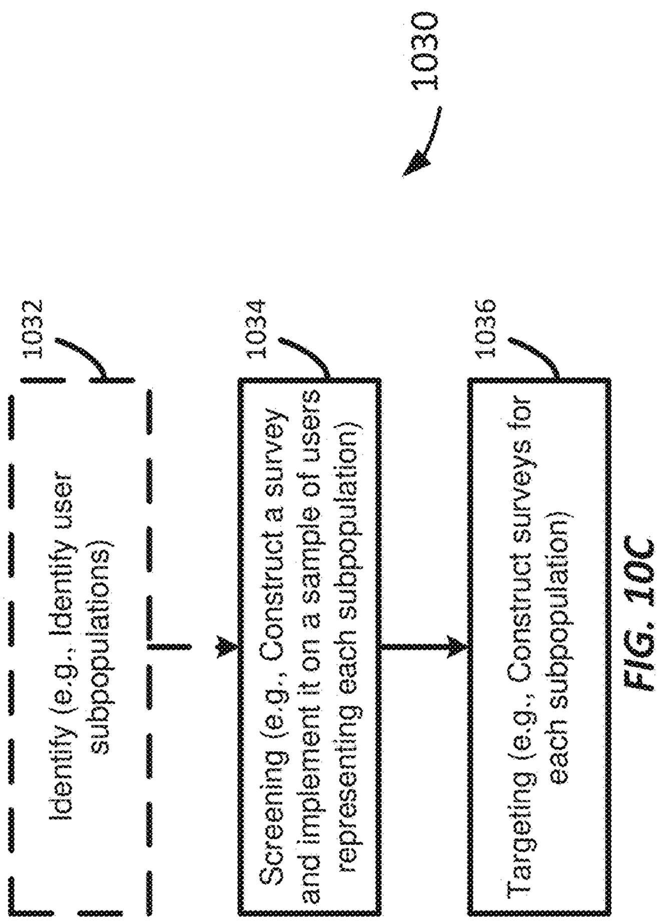
FIGS. 10C-10F illustrate example flow diagrams for experiments according to at least one embodiment of the present technology.

FIGS. 10C-10F illustrate example flow diagrams for experiments (e.g., ones conducted in the environment described in reference to FIGS. 10A-10B). FIG. 10C illustrates an example flow diagram 1030. The flow diagram 1030 can be used for discrete choice experiments (e.g., learning user interface preferences of user subpopulations in different contexts). The flow diagram 1030 can be considered a two-stage discrete choice experiment framework because in includes a screening stage in operation 1034 and a targeting stage in operation 1036 that can be applied to discrete choice experiments (e.g., experiment environment shown in FIGS. 10A-10B related to user interface preferences).

Operation 1034 could include constructing a computer-generated survey and implementing it on a sample of users. The sample of users can represent different subpopulations. A survey could include for example a question "Do you prefer user interface configuration A or B in context k?". A computing system could receive an answer: "I prefer A" or "I prefer B".

An optional operation 1032 (as shown) could be used for an identify stage to identify user subpopulations. For example, identifying could be based on categorical demographic information such as gender, marital status, country of origin, experience level with an environment, etc. For instance, if the experiment were related to user preferences for a software system, subpopulations could include new, moderate, or experienced users of the software system. Operation 1032 could be performed contemporaneously, as part of the operation 1034, or after operation 1034 (e.g., prior to or contemporaneously with operation 1036).

An operation 1036 includes a targeting stage in which a computing system can construct surveys for subpopulations (e.g., using information gathered in the screening stage to specify prior assumptions for each subpopulation). In embodiments, a new sample of users representing each subpopulation can receive and participate in a subpopulation specific survey. Collection tools need not be the same between subpopulations, and they can be different from the screening stage. For example, a target survey could go out to experienced users of an environment with two questions for each choice (e.g., Which of these two user interfaces would you prefer for personal use?" and "Which of these two user interfaces would you prefer to use for teaching a new user?"), while only one of these questions goes out to a subpopulation of new users.

Figure 10D:
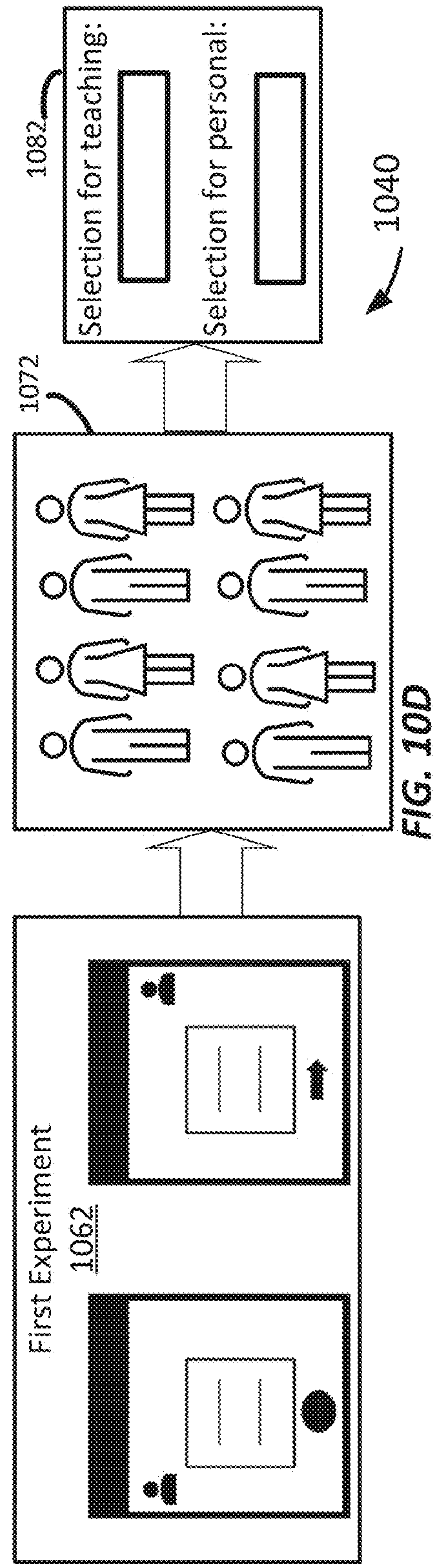
Figure 10E:
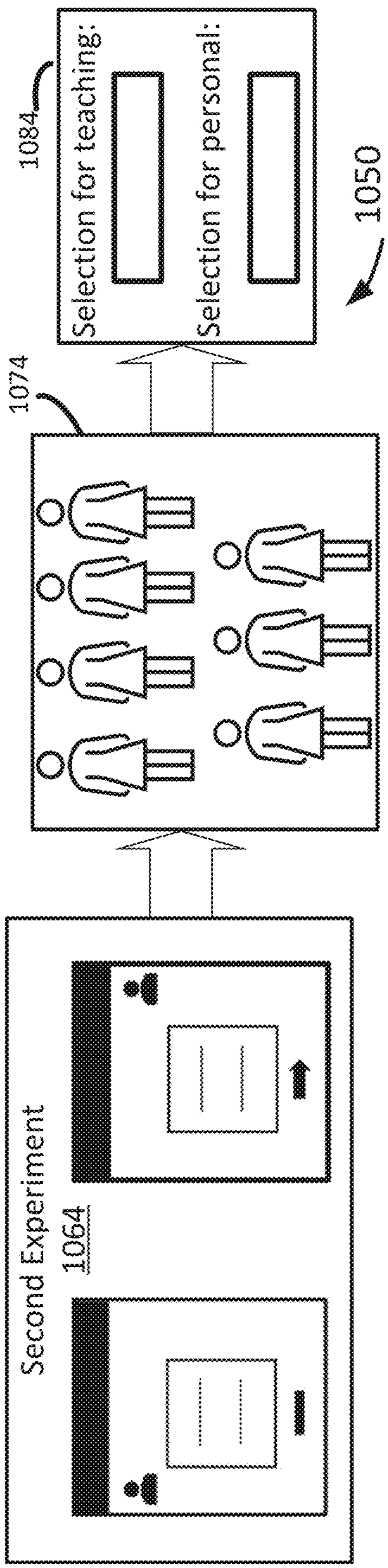
Figure 10F:
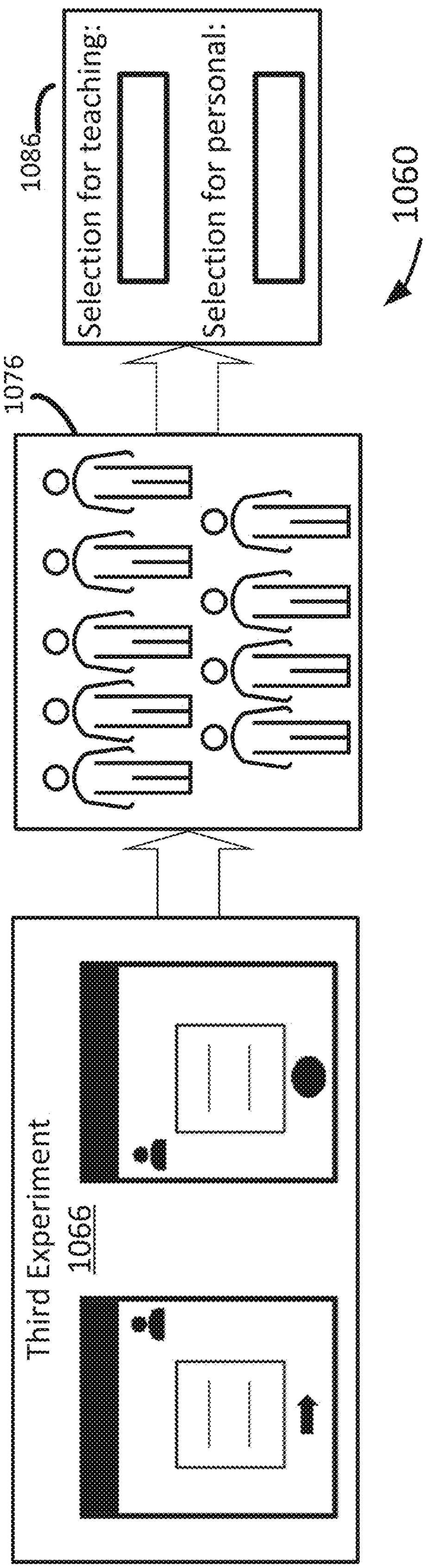

Operations 1032, 1034, and 1036 could involve multiple operations. For example, FIG. 10D shows example operations in a flow diagram 1040 for conducting a screening stage according to operation 1034. FIGS. 10E-10F shows example operations in a flow diagram 1050 and a flow diagram 1060, respectively, for conducting a targeting stage according to operation 1036.

FIG. 10D shows flow diagrams 1040 for experiments conducted for an environment (e.g., software system such as environment 1000 in FIG. 10A). In the example, a first experiment 1062 involves a software system interacted with by users 1072 that has at least two profile groups (e.g., male and female demographic profile groups and/or different experience levels such as new, moderate and experienced). The users 1072 can provide answers to a questionnaire 1082. In this example, the users can have more than one selection per question, and select based on a context factor (e.g., a selection of an interface for teaching purposes and selection of an interface for personal purposes).

Embodiments allow a computing system to take experiment data (e.g., a conducted choice experiment like first experiment 1062) and extract information to be used in a follow up experiment. Embodiments allow for segmentation in follow-up experiments based on subject information (i.e., demographics) so that specialized experiments can be created based on data gained in an initial experiment. For instance, a computing system can execute a multi-stage computing process to design and control targeted experiments.

For example, a computing system could execute a multi-stage computing process by providing a first experiment environment according to a screening stage of the multi-stage computing process where the different subjects represent different demographic categories of a population defining subpopulations (e.g., a process shown in FIG. 10D). Subject factors could be defined according to the different demographic categories. The computing system could obtain a predictive model for the first experiment by obtaining choice selections from the different subjects interacting with the first environment, and identification of demographic information pertaining to the different subjects. A computing system could display a second computing environment according to a targeting stage of a multi-stage computing process that is specific to subpopulations of the population. A computing system could control the second environment with subjects interacting with the second environment that are different from subjects of the first experiment but selected from a single subpopulation of the population in accordance with the selection of the first level.

In embodiments, a computing system controls the second experiment by generating a design for the second experiment. For instance, a design can specify multiple stages in the second experiment, and each stage of the multiple stages specifies a respective single candidate feature for each of profile factors. The computing system can control a test environment based on the design of a second experiment. FIG. 10E shows a flow diagram 1050 for a second experiment 1064 generated by a second computing system according to a constructed design based on a first experiment (e.g., first experiment 1062 in FIG. 10D). The second computing system can be the same or different as the first computing system that generated a first experiment. The second computing system generates specified candidate features for one or more stages of the multiple stages in a second environment (e.g., one displaying a graphical user interface for a tested software system). Users 1074 interact with this second environment. These users 1074 however are limited to a particular profile factor (e.g., all females). The users can make selections (e.g., based on different contexts) using questionnaire 1084. More than one experiment can be conducted limited to particular profile factor. FIG. 10F shows a flow diagram 1060 for a third experiment 1066. Third experiment 1066 can be conducted on users 1076 contemporaneously, prior to, or after second experiment 1064. Users 1076 can be limited to a different profile factor (e.g., all males). They can answer questionnaire 1086 with selections made for particular contexts.

Alternatively, or additionally, results from one study (e.g., a software usability study) can be used to create different, contextually tailored studies. For instance, questionnaires 1084 and 1086 provided to different groups can be different. Demographic information for limiting to a particular group can be obtained from a database to determine which version is provided to a participant or a computing system can ask for the information before starting a study and provide a tailed study based on the response.

Embodiments can create advantageous designs for experiments using a utility model computed based on a previous experiment (e.g., first experiment 1062). For instance, for a discrete choice model, a computing system could assume that user preference for a given option or alternative is characterized by a latent random utility model which is typically a function of the option being considered and possibly other option-external information. A generated discrete choice model could incorporate user demographic information and contextual use-case information into the latent utility model characterizing user preference. For example, a latent utility model could be represented in Equation (1) as:

$$U_{ijk\ell} = \beta^T (x_j \otimes z_{i,k}) + \epsilon_{ijk\ell} \quad (1)$$

Here $U_{ijk\ell}$ is the utility that user i places on a particular option j under context k (e.g., a user interface configuration). $x_j$ is a vector representation of main effects and/or interaction effects for profile factors (e.g., associated with a user interface configuration). $z_{i,k}$ is a vector representing intercept terms, main effects and/or interaction effects corresponding to subject i in context k (e.g., corresponding to demographics of a subject). Here ⊗ denotes the Kronecker product, an operation in linear algebra. The Kronecker product is a common shorthand method of writing interaction terms between two vectors. $\epsilon_{ijk\ell}$ is a Gumbel distributed error term, which can account for remaining portion of utility not described by enumerated factors (e.g., not described by a user interface configuration, demographic information or context information). β is a vector of parameters which will be estimated using data from a prior study or experiment. For instance, β can be a vector of partworths which characterize user preferences for estimation.

A latent utility model means that the model is generated not from direct utility information (e.g., a utility score that user places on a user interface configuration), but generated from indirect or inferred utility information (e.g., by presenting users a sequence of choices sets where they are tasked with selecting their preferred option amount two or more alternatives in a choice set). In one or more embodiments, a computing system can estimate marginal utility models for each of particular subject groups (e.g., demographic groups).

For example, a computing system can adjust means and variances according to formulas:

$$E(\beta_d) = L_d\hat{\beta}$$

$$Cov(\beta_d) = L_d Cov(\hat{\beta}) L_d$$

In detail, $\beta_d$ is a vector of partworths characterizing the preferences of subject group d, $L_d$ is a matrix which represents an effects coding of subject group d, and $\hat{\beta}$ is an estimate of parameters related to a full model which incorporates information from all profile and subject effects. Here, E( ) represents the expectation and Cov( ) the covariance of a vector of parameters, while $Cov(\hat{\beta})$ is the covariance of the estimated parameters related to the full model.

For instance, if the experiment were for a subject group of experienced users of a software and there were four profile effects where three of the profile effects had two levels and one effect had three levels. There is one subject effect having two levels. This information is reflected by the dimensionality of $L_d$.

$$\text{demo\_linear\_transform} = [1\ 0\ 0\ 0\ 0\ {-1}\ 0\ 0\ 0\ 0,\ 0\ 1\ 0\ 0\ 0\ 0\ {-1}\ 0\ 0\ 0,\ 0\ 0\ 1\ 0\ 0\ 0\ 0\ {-1}\ 0\ 0,\ 0\ 0\ 0\ 1\ 0\ 0\ 0\ 0\ {-1}\ 0,\ 0\ 0\ 0\ 0\ 1\ 0\ 0\ 0\ {-1}];$$

Embodiments can compute an estimated utility model of a chosen demographic group under a specified context for use in creating a subsequent design.

For example, if an engineer is interested in learning user preferences of a user interface of a software system that is used for statistical design of experiments, and in particular they are interested in learning the effect of two profile factors on user utility. The two profile factors in consideration are Hover Help Location and Significance Message, which are bi-level factors having levels {Confidence Interval, Preview Column} and {Status Quo, Alt 1}, respectively. The engineer has conducted a pilot study using a discrete choice experiment and collected choice data from a group of subjects. There is one bi-level subject factor determining the demographic groups, which is DOE Experience Level. This subject factor has levels {New-Moderate, Experienced-Expert}, and thus there are two demographic groups. Lastly, there are two contexts within which subjects are being asked to make comparisons. Subjects can use the software system for their own personal use in creating experimental designs or to teach others how to create experimental designs. These two contexts are defined by the context variable Context, which has levels {Personal Use, Teaching Others}.

For shorthand, Hover Help Location is referred to as $f_1$ and Significance Message $f_2$. In addition, DOE Experience Level is referred to as d and Context c. Then $f_{1,1}$ denotes Confidence Interval, $f_{1,2}$ denotes Preview Column, $f_{2,1}$ denotes Status Quo and $f_{2,2}$ denotes Alt 1. Furthermore, $d_1$ denotes New-Moderate and $d_2$ denotes Experienced-Expert, while $c_1$ denotes Personal Use and $c_2$ denotes Teaching Others. In this example it is assumed effects coding on each of these variables, so that $f_{1,1}=-1$, $f_{1,2}=1$, $f_{2,1}=-1$, $f_{2,2}=1$, $c_1=-1$, $c_2=1$, $d_1=-1$, and $d_2=1$. A computing system lets $x_1=[f_1, f_{2,1}]^T$, $x_2=[f_{1,1}\ f_{2,2}]^T$, $x_3=[f_{1,2}\ f_{2,1}]^T$, $x_4=[f_{1,2}\ f_{2,2}]^T$ be vectors encoding the profile effects of each of the four possible user interface configurations (in this example a computing system only considers main effects).

Lastly, let $z_{1,1}=[1\ d_1\ c_1]^T$, $z_{1,2}=[1\ d_1\ c_2]^T$, $z_{2,1}=[1\ d_2\ c_1]^T$, and $z_{2,2}=[1\ d_2\ c_2]^T$ be vectors encoding the demographic and contextual effects (in this example a computing system considers main effects with no interactions between demographic and contextual terms). Then the utility of configuration j of a subject or individual $\ell$ from demographic or subject group i under context k is given for Equation (1) as:

$$U_{ijk\ell} = \beta^T(x_j \otimes z_{i,k}) + \epsilon_{ijk\ell} \text{ for } i = 1, 2;\ j = 1, 2, 3, 4;\ k = 1, 2.$$

As described in more detail with respect to Equation (1), $x_j$ is a vector representation of main effects or interaction effects for profile factors (e.g., associated with a user interface configuration). $z_{i,k}$ is a vector representing main effects or interaction effects corresponding to subject i in context k (e.g., corresponding to demographics of a subject). It includes an intercept term. Here $\otimes$ denotes the Kronecker product, $\epsilon_{ijk\ell}$ is a Gumbel distributed error term, and $\beta$ is a vector of parameters which will be estimated using data from the prior study. For instance, $\beta$ can be a vector of partworths which characterize user preferences for estimation.

In a first screening stage, if the estimated the utility model parameters are given as $$\hat{U}_{imnk} = \widehat{\beta_1} f_{1,m} + \widehat{\beta_2} f_{2,n} + \widehat{\beta_3} d_i f_{1,m} + \widehat{\beta_4} d_i f_{1,n} + \widehat{\beta_5} c_k f_{1,m} + \widehat{\beta_6} c_k f_{1,n}$$

Here, m and n can take on the values of 1 or 2. In this example, $$\hat{\beta}^T = [0.5\ \ 0.25\ \ 0.5\ -\ 0.5\ \ 0.25 - 0.25],$$

and that $$Cov(\hat{\beta}) = Diag([0.2\ \ 0.1\ \ 0.2\ \ 0.25\ \ 0.15\ \ 0.1]) = \begin{bmatrix} 0.2 & 0 & 0 & 0 & 0 & 0 \\ 0 & 0.1 & 0 & 0 & 0 & 0 \\ 0 & 0 & 0.2 & 0 & 0 & 0 \\ 0 & 0 & 0 & 0.25 & 0 & 0 \\ 0 & 0 & 0 & 0 & 0.15 & 0 \\ 0 & 0 & 0 & 0 & 0 & 0.1 \end{bmatrix},$$

That is, the covariance matrix of $\hat{\beta}$ is a diagonal matrix with the given values along the diagonal.

If an engineer is interested in targeting Experienced-Expert users of DOE under the context of Personal Use. Then, to calculate the utility model of this particular demographic group under this particular context, the computing system can determine the following matrix:

$$L(d_2, c_1) = [1\ \ d_2\ \ c_1] \otimes I_2 = \begin{bmatrix} 1 & 0 & 1 & 0 & -1 & 0 \\ 0 & 1 & 0 & 1 & 0 & -1 \end{bmatrix}.$$

Even with just two profile factors, the matrices in this example are very difficult to compute and are done with the use of specialized computing equipment as described herein in this example. Since there are only two profile factors, there are just two rows in this matrix. Since there are six parameters in the estimated utility model above, there are six columns. To calculate the utility model parameters estimates for Experienced-Expert users of DOE under the context of personal use, the computing system computes:

$$\hat{\beta}(d_2, c_1) = L(d_2, c_1)\cdot\hat{\beta} = [\,0.75 \quad 0\,]^T$$

$$\hat{U}_{imnk} = \widehat{\beta_1} f_{1,m} + \widehat{\beta_2} f_{2,n}$$

$$\hat{U}_{imnk} = 0.75 f_{1,m} + 0 f_{2,n}$$

A similar computation for the covariance matrix is:

$$Cov\big(\hat{\beta}(d_2, c_1)\big) = L(d_2, c_1)\cdot Cov\big(\hat{\beta}\big)\cdot L(d_2, c_1)^T = Diag([\,0.55 \quad 0.45\,]) = \begin{bmatrix} 0.55 & 0 \\ 0 & 0.45 \end{bmatrix}$$

Figure 14A:
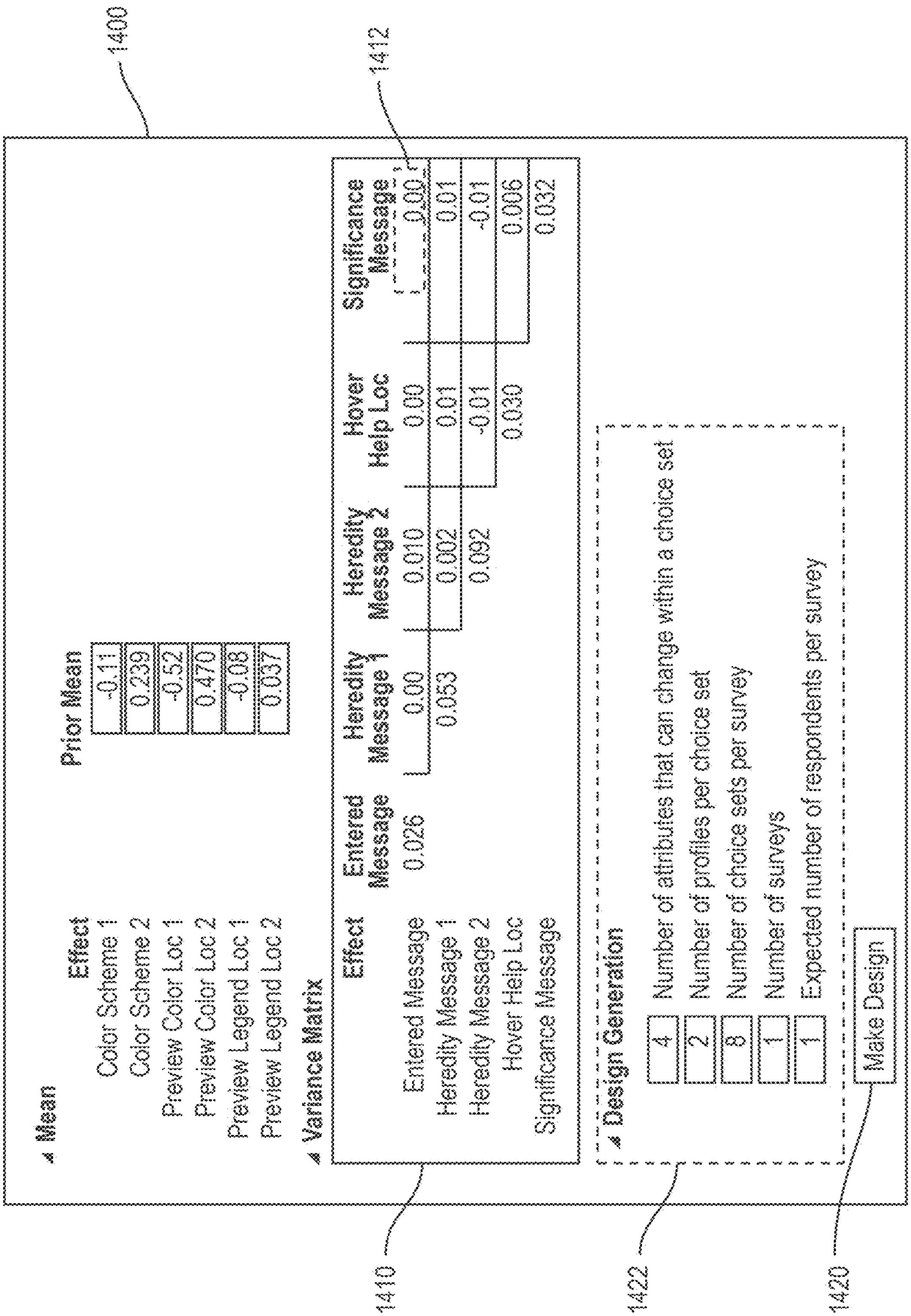
FIGS. 14A-14B illustrate graphical user interfaces for generating a design specific to a subject factor level in at least one embodiment of the present technology.
Figure 14B:
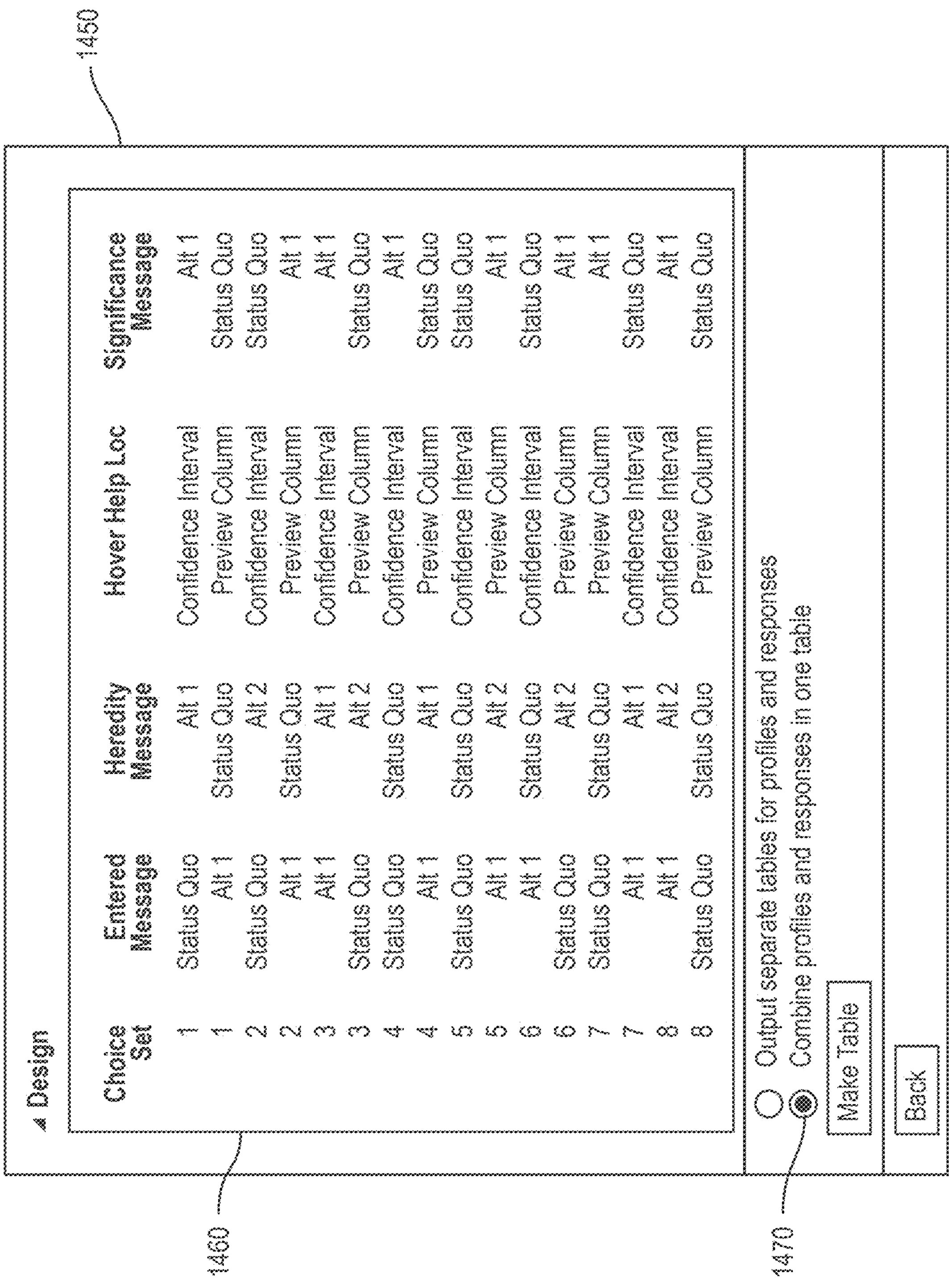

Now, these utility model parameter estimates and covariance estimates for this particular demographic group under this particular context can be used as prior information to create a discrete choice design (e.g., a D-optimal design) for subsequent study of this group under this context (e.g., according to a computed model representation from an initial model). FIGS. 11A-11B illustrate data for generating an initial predictive model. FIGS. 14A-14B illustrate graphical user interfaces for computer representations for fixed-factor models from an initial predictive model (e.g., generated parameter estimates and covariance estimates).

FIG. 11A shows a table 1120 of data for a design of a discrete choice experiment in which different subjects selected between different displayed images of a user interface using a survey. In this example, multiple surveys were used, but for purposes of brevity representative data is shown from only a few questions of a survey for a few participants. Survey column 1122 indicates the survey the data was from because a model could be generated from multiple surveys. A choice set column 1124 indicates the choices displayed to the user for items 9 and 10 of multiple choice sets. Position column 1126 shows the position for images shown to a user and identified in pick column 1128. As shown the images are different in the two positions and the user picks one of the images.

In this example, a computing system receives indications based on different subjects interacting in an experiment with an environment supporting a graphical user interface that is displaying the images identified in pick column 1128. The indications indicate selections by different subjects between defined choices for the environment defined according to displayed features for profile factor(s). The displayed features are displayed based on a design for the experiment. User selection is shown with a "1" in pick column 1128. The subject making the selection and interacting with the particular image is identified with a number in subject column 1130. In this example, for each item there will only be one selected in this example (i.e., for a given choice set for a particular subject there will be one position with a 1 and one with a 0). In other examples more than one choice can be made. Profile factor data regarding the image is shown in color preference 1132, preview column 1134, preview legend column 1136 and hover help preference column 1138.

FIG. 11B shows a table 1150 of subject data collected for the survey data shown in FIG. 11A. The data could be collected at the time of the survey, prior to the survey, or after completion of the survey. The data can be correlated with the particular subject. For example, survey column 1122, choice set column 1124, subject column 1130 from FIG. 11A are shown here in table 1150. Here demographic information is collected on experience level and color blindness and user preferences. For example, color-related column 1152 shows returned results on a question related to distinguishing between colors. The data collected is related to a computing environment involving a JMP® platform with design of experience (DOE) software tools and easy DOE software tools. Other platform or software tools could have been used.

In some embodiments, data can include received user input or computer-generated data (e.g., according to a new classification system). For example, JMP® platform experience column 1154 includes user input regarding experience or exposure with a JMP® platform (e.g., year ranges recorded). This data could alternatively have been sourced from database information such as subscription information. This data could be computer-generated (e.g., generating a year range based on a single year value given). JMP® platform recorded classification column 1156 includes computer-generated data classifying the JMP® platform experience or exposure level in JMP® platform experience level column 1154. For example, experience of 2-5 years is classified in this example as a "New User-Moderate Experience" and years of experience of more than five are classified in this example as "Experienced" in JMP® platform recorded classification column 1156. Classification levels could be different than recorded answers. For example, 1-2 years and 2-5 years could all be classified as "New User-Moderate Experience"). This dataset also includes recorded data for particular software tools on a platform related to Design of Experience (DOE) (i.e., DOE experience level column 1158, and DOE Experience Level Recorded classification column 1160), and Easy DOE (i.e., "Used Easy DOE before?" column 1162). Other data could be collected such as preferred usage modes of the software tools in "Preferred Usage Mode?" column 1164 in which the users specifies options such as "guided" mode and "I don't use Easy DOE". Data Type column 1166 provides a label as to how data is used in generated a computing model (e.g., was used in "training" or for "validation").

Collected data can be based on user responses (e.g., direct responses or reclassification of responses). Alternatively, or additionally, collected data can be determined indirectly. For example, if a studied environment was a city and the experiment is related to identifying the best modes of travel within a city for infrastructure support, then GPS devices, camera data, information, and communications technology systems, etc. can be used to record data related to modes of travel choices within a city. For example, bus ridership changes before and after electronic systems are left on the street, could show choices between these modes of travel.

In one or more embodiments, a computing system can generate a predictive model by obtaining input data like the input data shown in FIGS. 11A and 11B based on recorded levels for subject factor(s) from conducting a first experiment according to a design of a first experiment and obtaining output data (e.g., output data shown in FIG. 11A) based on recorded outputs from conducting the first experiment according to the design of the first experiment. The computing system can train the predictive model based on the input data and output data and validate that model. In some embodiments, the data is collected according to a design for a first experiment (e.g., based on obtained profile factors). The design specifies candidate features for profile factor(s) for conducting an experiment (e.g., profile factor data regarding the image is shown in color preference 1132, preview column 1134, preview legend column 1136 and hover help preference column 1138)

Figure 12A:
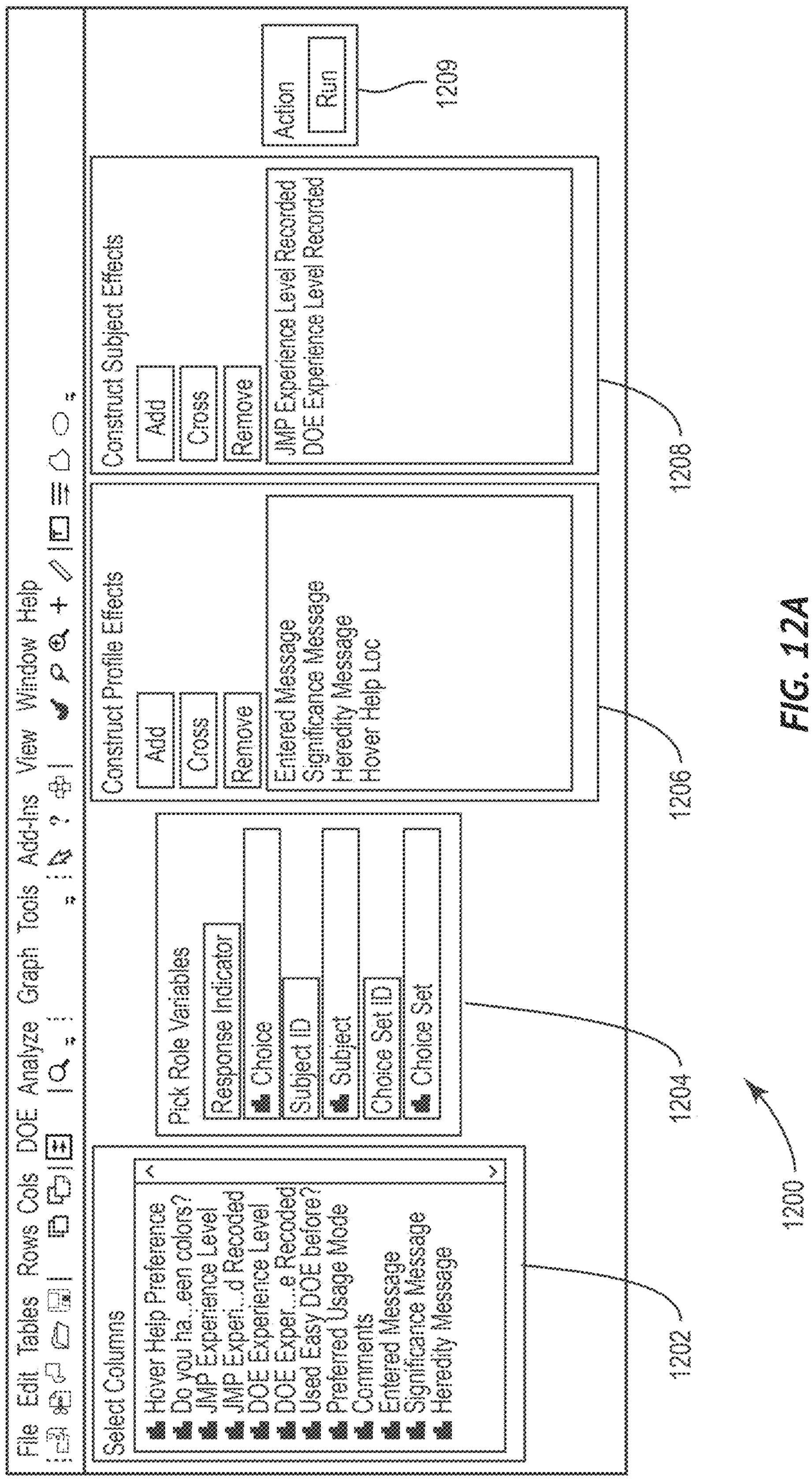

FIGS. 12A-12E illustrate graphical user interfaces for analyzing a computer model. In this example, the computer model is for an environment that is a software environment controlling display of a graphical user interface. FIG. 12A illustrates a graphical user interface 1200 for obtaining factors for the predictive model. Select control 1202 allows a user to select a particular column of data (e.g., data columns shown in FIGS. 11A-11B). Profile control 1206 allows a user to add a selected column to a profile factor list, and subject control 1208 allows a user to add a selected column to a subject factor list. The subject factors specify demographic information of users of the software tool interacting with the display. For example, the user has selected subject factors related to specific type of experience level with computing systems and computing applications (e.g., Design of Experience, DOE). The profile factors in this example specify features for the display in the software environment. For instance, the user has selected profile factors related to entered message, significance message, heredity message, and hover help location. Role control 1204 allows a user to select data for other aspects of model generation such as response indicator type, a subject identifier, and a choice set identifier. For example, the response indicator here is "choice" because the model is applicable to a discrete choice experiment. Here the discrete choice experiment controls the display for accessing a usability of the software environment in accordance with different displayed features according to the profile factors. A predictive model can be generated for the profile factors and the subject effects using action control 1209.

Figure 12B:
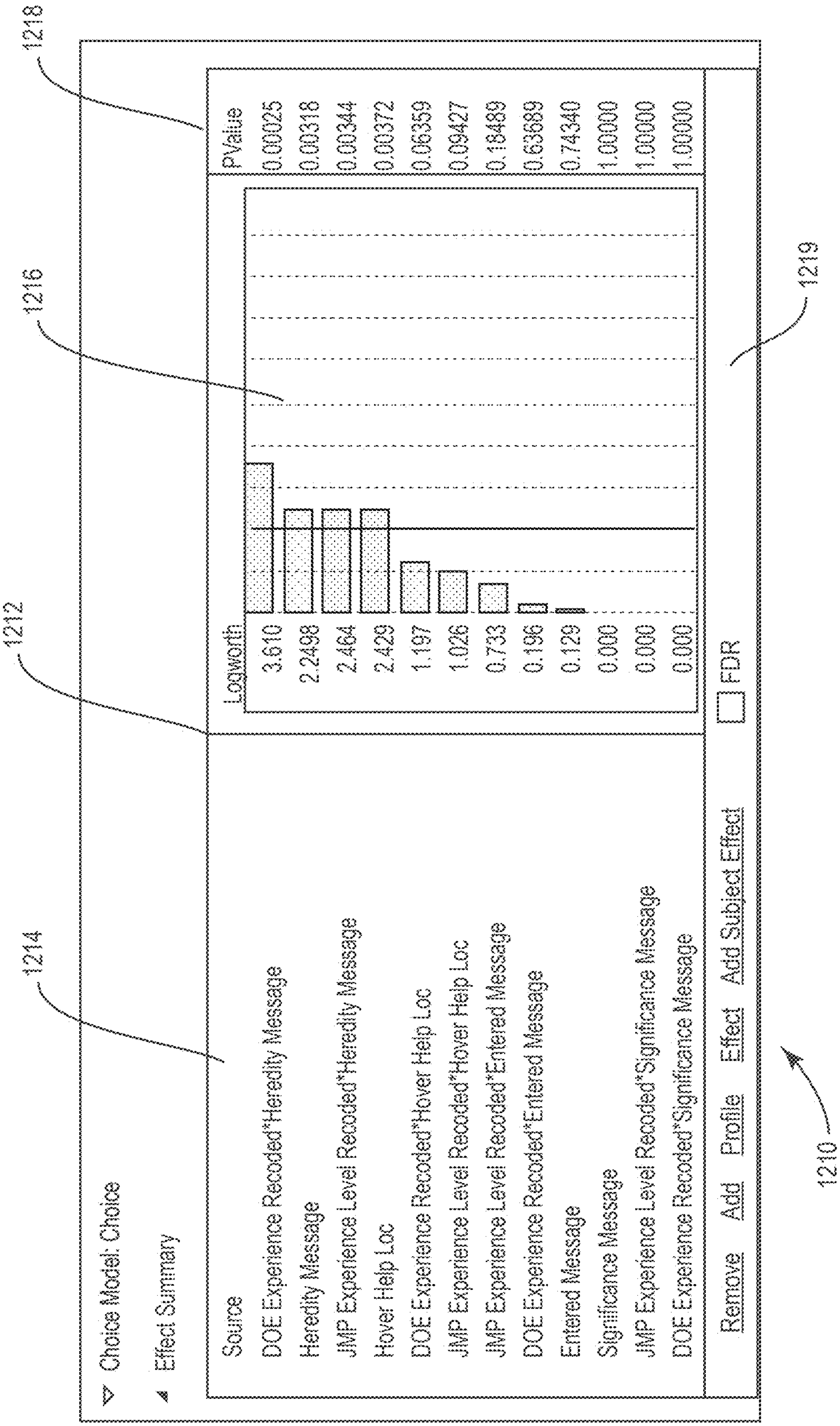

FIG. 12B illustrates a graphical user interface 1210 representing a computer-generated model generated according to the selections made in graphical user interface 1200 of FIG. 12A. For instance, FIG. 12B illustrates a graphical user interface 1210 displaying model effects for a predictive model. In this example, an effects summary table 1212, shows the model terms for the model in model column 1214. As shown the model terms in this example include profile factors (e.g., "Hereditary Message" and "Entered Message") and subject factors (e.g., "DOE Experience Recorded") selected in graphical user interface 900 and their interactions (e.g., "DOE Experience Recorded*Hereditary Message").

In embodiments, graphical user interface 1210 can further display information for the user to evaluate or adjust model terms. For example, effects summary table 1212 provides logworth values in logworth chart 1216 and p-values in Pvalue column 1218. The graphical user interface 1210 is similar to the graphical user interface 930 described with reference to FIG. 9B. For example, a user can further adjust the model selecting model terms using model controls 1219 in which a user can further adjust the model (e.g., selecting model terms to remove or add further profile or subject terms or for adjusting a p-value to ensure a false discovery rate (FDR)).

A generated computer model can be represented by other information (e.g., for user adjustment). For instance, FIG. 12C illustrates a graphical user interface 1220 displaying parameter estimates for a predictive model. FIG. 12D illustrates a graphical user interface 1240 displaying correlations of estimates for a predictive model. FIG. 12E illustrates a graphical user interface 1260 displaying likelihood ratio tests for a predictive model. One or more representations of the model can be adjusted for adjusting an initial model generated from experiment data. The initial model can be used for generating representations of a fixed-factor model (e.g., after setting a subject factor to a particular level).

Figure 13A:
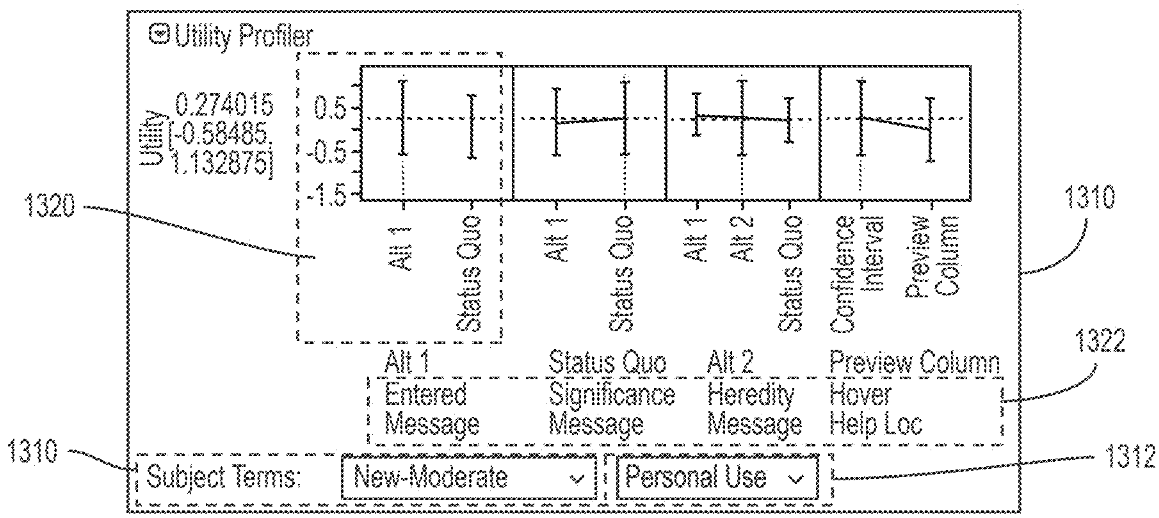
FIGS. 13A-13C illustrate profilers for visualizing a computer model according to one or more subject factors in at least one embodiment of the present technology.
Figure 13B:
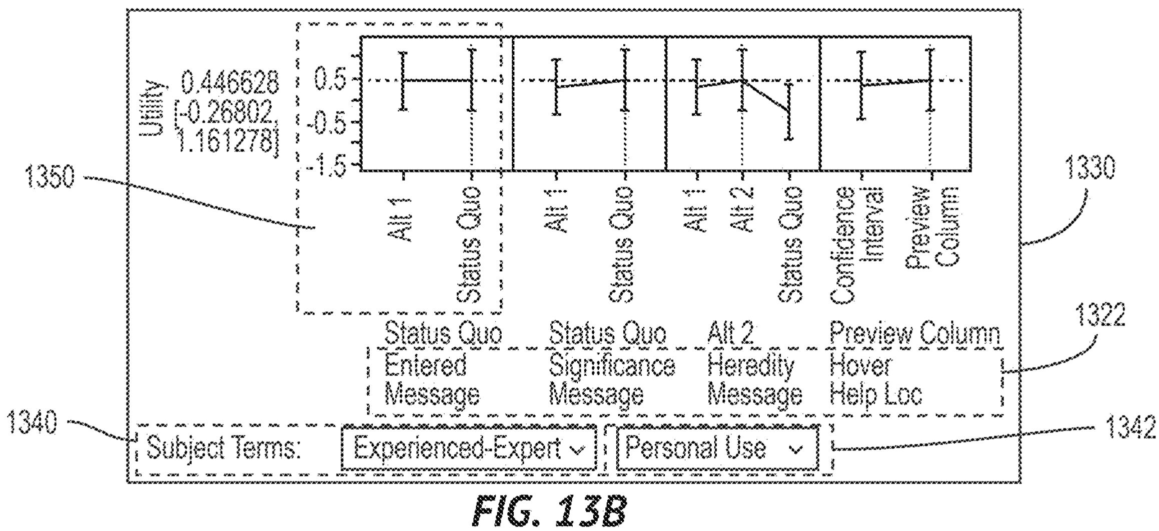
Figure 13C:
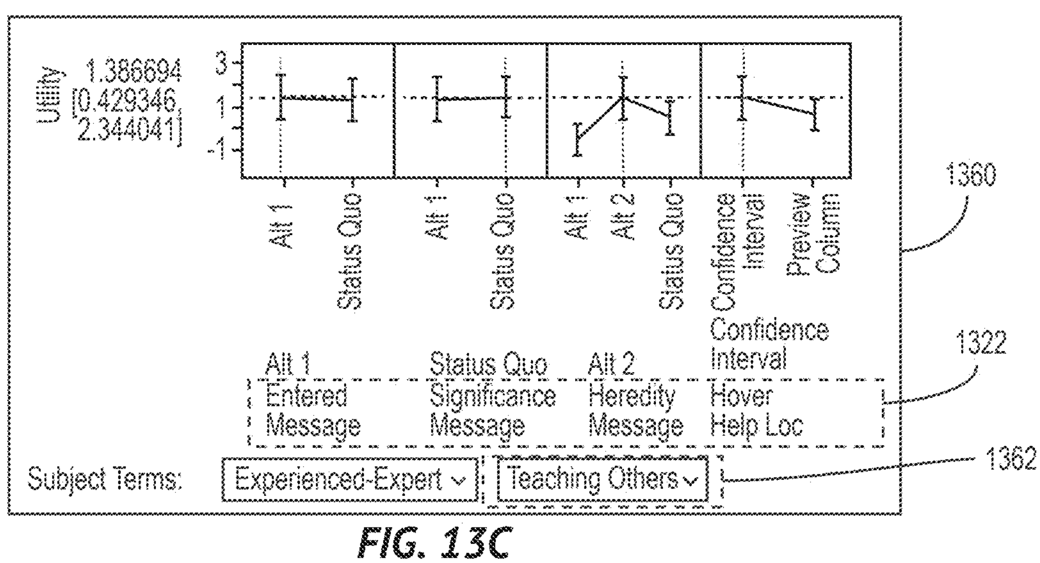

FIGS. 13A-13C illustrate profilers for visualizing a computer model according to one or more subject factors. FIG. 13A illustrates a profiler 1300. Subject term selection 1310 fixes a particular subject factor for viewing utility in profiler 1300. Level selection 1312 fixes a particular level for that subject factor. The utility profiler can then update to reflect utility of particular features for profile factors given the fixed-factor model. For example, chart 1320 shows the respective utilities of different features for an entered message in a test environment testing preference of a status quo and an alternative version for the entered message. There is a respective chart in proximity to each of profile factors shown in portion 1322 of profiler 1300. In this example, particular features can be selected to explore relative utility of various features for a given profile factor.

In embodiments, the profilers are interactive in that a user can select different subject factors to fix and utilities can adjust based on the selected subject factor and level fixed. For instance, FIG. 13B illustrates a profiler 1330 with a different subject selected in subject term selection 1340 and level selection 1342. Chart 1350 shows the updates to relative utilities for different options for the entered message factor. As shown, there is a smaller disparity in utility between options in chart 1350 as in chart 1320. The user can use profilers like profiler 1300 and profiler 1330 to make decisions on what profile factors to include in follow-up experiments for a fixed subject factor. For example, entered message can be excluded from profile factors on experienced users interacting with a software environment for personal use but can be included for new users interacting with the software environment for personal use. Even a selected level can have an influence on relative utility. FIG. 13C illustrates a profiler 1360 according to an updated selection level 1362 selecting a purpose of teaching others.

FIGS. 12A-E that showed that the representation of the predictive model do not provide direct access to representations of models for each of different subject group selections. Given the interdependence shown in the profilers in FIGS. 13A-13C, to account for these subject effects (e.g., different experience levels), model adjustments need to be adjusted to create separate designs for different subject groups (e.g., adjustments to parameter estimates and covariance matrixes). Separate designs can be created for each of subject groups with adjusted means and variances from a previous utility model.

FIG. 14A illustrates graphical user interface 1400 for generating a design 1460 specific to a level of a subject factor. In this example, a computing system has generated a computer-generated representation of a computer model by generating parameter estimates for model terms of the fixed-factor model. The parameter estimates are shown in variance matrix chart 1410. These parameters estimates for the fixed-factor model are computer-generated and different from the original parameter estimates for the predictive model shown in FIG. 12B. For instance, there are fewer model terms since some factors are held fixed, and model term values have changed for remaining factors. This update can account for an interdependence between variables in an experiment.

In some embodiments, graphical user interface 1400 is interactive. For instance, the computing system can display in graphical user interface 1400 computer-generated representation of a fixed-factor model that a user can change. For instance, cell 1412 in variance matrix chart 1410 is currently at a zero value. The user could adjust that variance to a non-zero value. The computing system could receive a request to change the computer-generated representation or the fixed-factor model and generate, based on the request, an updated computer-generated representation. For instance, the variance matrix could change in response or other representations in graphical user interface 1400 could change if there was interdependence of values.

Graphical user interface 1400 has a design control 1420 for receiving input to generate a design based on the displayed values for a fixed-factor model (either as generated or as updated). For instance, graphical user interface 1400 has design controls 1422 similar to design controls in section 970 in graphical user interface 960 in FIG. 9D. In embodiments, a computing system can generate a design, based on the computer-generated representation(s) (or updated ones) that is specific to a particular level for a particular subject. FIG. 14B illustrates a graphical user interface 1450 of a generated design specific to a level for a subject factor. In other words, in this example, even though there were multiple subject factors shown in FIG. 12A related to different experience levels for different systems and system components, the design in FIG. 14B is specific to a user with a specific type of experience level and the design is specific to this selection set with a single level for each of the subject factors. As shown the design specifies multiple stages in the second experiment. Each stage of the multiple stages specifies a single candidate feature for each of profile factors of the multiple factors. This design for the second experiment is a D-optimal design that minimizes a covariance of the parameter estimates based on a fixed-factor model. The fixed-factor model predicts multiple candidate outcomes for a follow-up experiment with subjects defined by the selection set for the profile factors. However, each of the multiple candidate features specified by the profile factor(s) is represented in the design. For instance, FIG. 12A shows profile factors related to entered message, significance message, heredity message, and hover help location and design 1460 shows an option for each of those in the choice sets.

Previous approaches to design a choice experiment had a breakdown after running an initial study, because a person would have to analyze that initial data set and try to port that information back to a choice experiment tool again. It is a tedious task and did not factor in particular demographic information. In embodiments, a computing system can analyze a choice experiment and choose subject (i.e. demographic) effects that will not only be considered in the analysis, but also generate experimental designs for subsets according to that demographic information. In applied systems, the computing system can generate an initial design, collect profile information (e.g., from subjects or a predefined database), collect the data, analyze, and create new designs to administer via the computing system. With demographic information available, or asking the questions ahead of time, the computing system can target different demographics with additional questions that may only be pertinent to certain groups and ensure a computing system is taking advantage of updated information about these different groups. For example, in this case the computing system can display a status quo or Alt 1 for the entered message or hereditary message to a user according to a design 1460. The computing system can collect responses according to one or more targeted experiments. For instance, portion 1470 of graphical user interface 1450 enables a user to select options for display of collected responses (e.g., whether to output them in separate tables or one table).

One design is shown in this example, but separate designs can be created for each of the different groups defined by subject effects. With multiple subject effects the particular subject groups can be user defined to limit how many designs are created (e.g., graphical user interface 940 in FIG. 9C limits selection to just one subject and level for selecting to make a design). Embodiments can also allow customization of follow up experiments when segments in the population of interest have been identified. For example, graphical user interface 1450 can be interactive to allow a user to change specified options for follow up experiments.

In the example in FIG. 14B, the computing system is creating a test for usability of a software system and the computing system can create usability study/design via a choice experiment in the usability tool. The computing system can collect data from that study and collect demographic/subject information, analyze that study, either stopping there, or use the results to generate new studies for different subgroups. The computing system can customize the new studies, including new questions, either distributing them according to known group assignment, or by beginning the study with questions to determine group assignment.

For example, a usability study can test which factors of a user interface configuration are significant in determining user preference. Demographic groups of interest in this example include new-moderate users of design of experiments and experienced-expert users of design of experiments. Using this data and the demographic-targeting contextual discrete choice experiment tool (e.g., shown in FIG. 12A), a computing system can compute means and variances to construct follow-up questionnaires for the two subject groups (e.g., shown in FIG. 14A). A computing system can administer these questionnaires to the two groups. The groups can have different numbers of subjects (e.g., 10 participants in the new-moderate group and seven participants in the experienced-expert group). Experiments can be contextualized. For example, the questionnaires can have both groups consider their preferences of the user interface configurations for personal use, and the experienced-expert group can consider their user interface preferences under the context of using the application to teach others about design of experiments.

In embodiments, computing systems can be improved based on the results of these experiments. For example, if an experienced-expert user preferred a certain level in a factor called "heredity message" when they are teaching, this information could then be used to guide the process of designing personalized user interfaces for individuals in the experienced-expert group when they need to use the application for teaching others about design of experiments.

Figure 15:
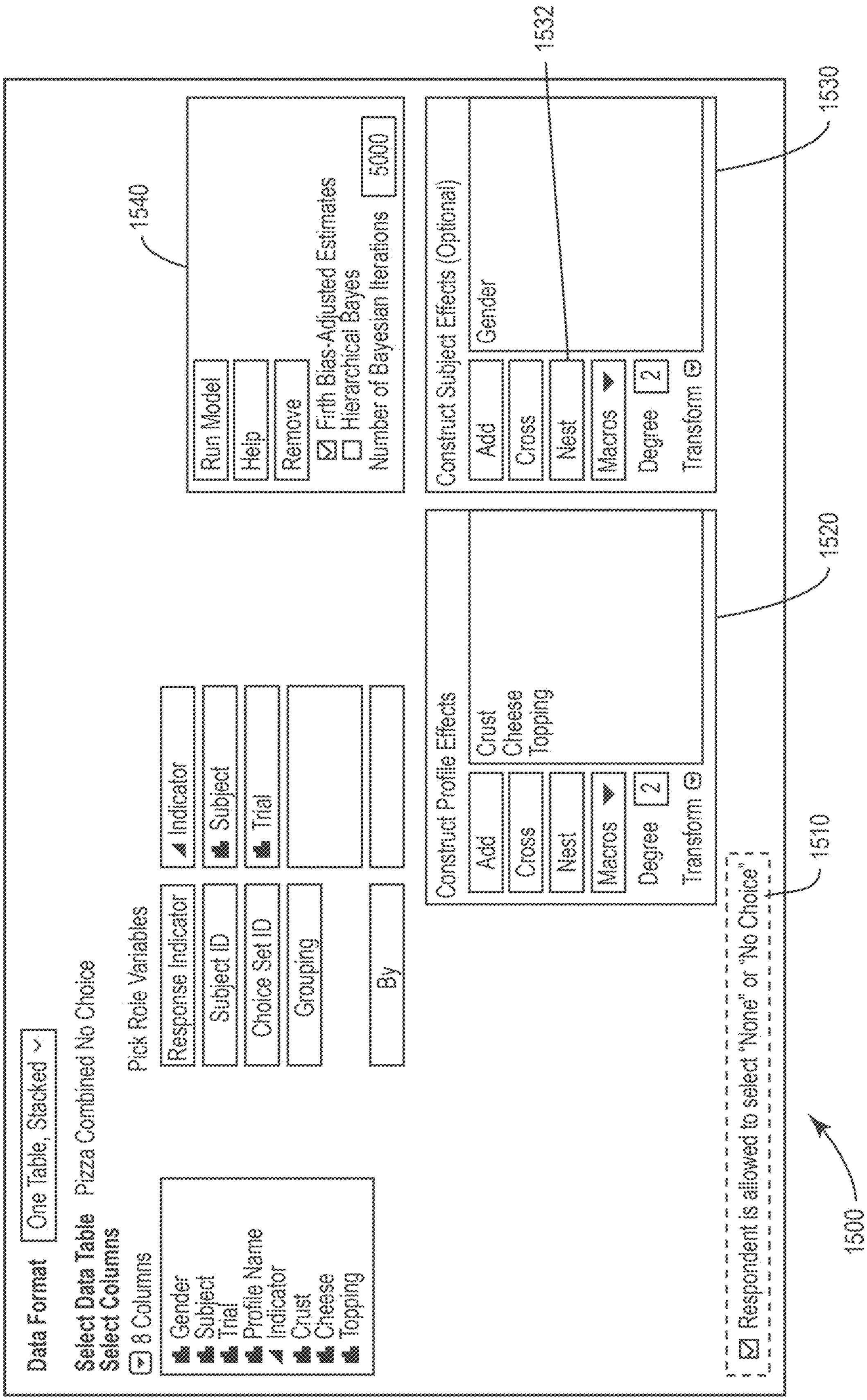
FIG. 15 illustrates a graphical user interface for generating an experiment and model in at least one embodiment of the present technology.

Different graphical user interfaces can be used than shown herein (e.g., to give users greater options for model generation or experiment design). FIG. 15 illustrates a graphical user interface 1500 for generating an experiment and model for an experiment involving a pizza environment. The graphical user interface 1500 allows users to select profile factors in profile portion 1520 for a discrete choice experiment involving a pizza (e.g., providing different crust types, cheese types, and topping types). Selection of subject factors is in subject portion 1530 (e.g., gender). More options are provided for factors in this graphical user interface 1500 than shown in other examples. For example, factors can additionally be denoted as nested (e.g., using nesting control 1532). With nested factors each category of one factor only occurs with one factor of another. For example, crust type can be nested with topping if there are certain toppings that can only go on certain crusts. Graphical user interface 1500 allows for a control 1510 for conducting experiment in which the respondent is allowed to select "none" or "no choice". Graphical user interface 1500 also allows for greater control of model generation than in other examples. For instance, model portion 1540 has controls, for instance, for using firth bias-adjustment estimates which can be useful, for instance, for smaller datasets. Further it has controls for using hierarchical Bayes modeling and setting the number of iterations.

One of ordinary skill in the art will appreciate other modeling, factor, or choice experiment options that could be displayed. Once a utility model is generated, fixed factor model designs and experiment control can be generated using techniques described with respect to other examples. Accordingly, embodiments herein provide computing systems, devices and graphical user interface for generating representations of fixed factor models and constructing designs and experiments around those fixed factor models.

What is claimed is:

1. A computer-program product tangibly embodied in a non-transitory machine-readable storage medium, the computer-program product including instructions operable to cause a first computing system to:

obtain, by the first computing system, multiple factors for a first environment in a first experiment, wherein the multiple factors comprise:

one or more profile factors, wherein each profile factor of the one or more profile factors specifies multiple candidate features for the first environment; and one or more subject factors, wherein each subject factor of the one or more subject factors specifies multiple candidate levels categorizing different subjects interacting with the first environment;

obtain, by the first computing system, a predictive computer model for predicting probabilities of multiple candidate outcomes for the first environment, wherein the predictive computer model has weighted model terms representing a contribution of the multiple factors to a given predictive outcome for the predictive computer model, wherein the weighted model terms for the predictive computer model comprise a first model term and a second model term, wherein the first model term is associated with a first subject factor in the predictive computer model and the second model term is associated with a first profile factor, or a second subject factor, in the predictive computer model; and generate, by the first computing system, a computer-generated representation of a fixed-factor model by:

receiving a selection of a first level for the first subject factor in the predictive computer model, wherein the receiving the selection indicates to fix the first level for the first subject factor;

automatically generating for the fixed-factor model a different weight for the second model term from the predictive computer model, wherein the different weight accounts for the first level for the first subject factor that is fixed responsive to the selection; and generating, based on the different weight of the second model term and the first level for the first subject factor that is fixed, the computer-generated representation of the fixed-factor model, wherein the fixed-factor model predicts multiple candidate outcomes for a second environment with subjects defined by the selection of the first level for the first subject factor, and wherein the computer-generated representation of the fixed-factor model is generated from the predictive computer model without using model training data.

2. The computer-program product of claim 1, wherein the instructions are operable to cause the first computing system to generate, based on the computer-generated representation of the fixed-factor model, a design for a second experiment specific to the first level for the first subject factor;

wherein the design specifies multiple stages in the second experiment; and wherein each stage of the multiple stages specifies a single candidate feature for each of profile factors of the one or more of the multiple factors.

3. The computer-program product of claim 1, wherein the instructions are operable to cause the first computing system to control a second experiment by:

generating a design for the second experiment, wherein the design specifies multiple stages in the second experiment;

wherein each stage of the multiple stages specifies a respective single candidate feature for each of profile factors of the one or more of the multiple factors; and wherein the second environment is a generated by a second computing system; and controlling, based on the design for the second experiment, the second computing system to generate specified candidate features for one or more stages of the multiple stages in the second environment.

4. The computer-program product of claim 1, wherein the instructions are operable to cause the first computing system to:

obtain the multiple factors by receiving multiple subject factors;

receive a selection of a second level;

generate multiple different fixed-factor models, wherein:

a first fixed-factor model is with respect to the selection of the first level for the first subject factor;

a second fixed-factor model is with respect to the selection of a second level; and the second level is a different level for the first subject factor from the first level or pertains to the second subject factor.

5. The computer-program product of claim 1, wherein the instructions are operable to cause the first computing system to obtain the predictive computer model by:

generating a design for the first experiment based on the one or more profile factors, wherein the design specifies candidate features for the one or more profile factors for conducting the first experiment;

obtaining input data based on recorded levels for the one or more subject factors from conducting the first experiment according to the design of the first experiment;

obtaining output data based on recorded outputs from conducting the first experiment according to the design of the first experiment; and training the predictive computer model based on the input data and output data.

6. The computer-program product of claim 1, wherein the instructions are operable to cause the first computing system to obtain the selection of the first level for the first subject factor by:

assessing a relevance of the one or more subject factors to the predictive computer model; or displaying in a graphical user interface a computer-generated assessment of the one or more subject factors to the relevance of the predictive computer model.

7. The computer-program product of claim 1, wherein the instructions are operable to cause the first computing system to:

generate the computer-generated representation of the fixed-factor model by generating parameter estimates for model terms of the fixed-factor model; and generate a design for a second experiment that is a D-optimal design that minimizes a covariance of the parameter estimates.

8. The computer-program product of claim 1, wherein the instructions are operable to cause the first computing system to:

receive classifications of levels for the first subject factor that provide different classifications of levels than in the first experiment such that there is a different quantity of candidate levels for the first subject factor in the first experiment than the first subject factor in a second experiment; and receive the selection of the first level by selecting a level classified according to the second experiment.

9. The computer-program product of claim 1, wherein the first experiment is a discrete choice experiment in which the first computing system receives indications based on different subjects interacting with the first environment; and wherein the indications indicate selections by the different subjects between defined choices for the first environment defined according to selected features for the one or more profile factors selected based on a design for the first experiment.

10. The computer-program product of claim 1, wherein the first environment and the second environment represent a same environment, and the one or more of the multiple factors comprise all of the one or more profile factors.

11. The computer-program product of claim 1, wherein the one or more profile factors comprise multiple profile factors; and wherein the first environment and the second environment are different environments; and wherein the instructions are operable to cause the first computing system to obtain a selection of one or more factors for the second environment; and wherein the selection of the one or more factors comprises:

less than all of the multiple profile factors for the first environment;

one or more additional factors than those of the multiple profile factors for the first environment; or both.

12. The computer-program product of claim 1, wherein the instructions are operable to cause the first computing system to:

receive the selection of the first level of the first subject factor by:

displaying a graphical user interface comprising the one or more subject factors and respective levels of the one or more subject factors; and receiving the selection in the graphical user interface; and display in the graphical user interface the computer-generated representation of the fixed-factor model.

13. The computer-program product of claim 1, wherein the instructions are operable to cause the first computing system to:

display a graphical user interface;

receiving, via the graphical user interface, input specifying the one or more profile factors and respective candidate features of the one or more profile factors;

receiving, via the graphical user interface, input specifying the one or more subject factors and respective levels of the one or more subject factors; and receiving, via the graphical user interface, the selection of the first level for the first subject factor.

14. The computer-program product of claim 1, wherein the instructions are operable to cause the first computing system to obtain the multiple factors by:

displaying a graphical user interface comprising predefined subject factors; and receiving a selection of the one or more subject factors from the predefined subject factors.

15. The computer-program product of claim 1, wherein the instructions are operable to cause the first computing system to obtain the multiple factors by:

displaying a graphical user interface comprising extracted factors from the predictive computer model; and receiving a selection of the one or more profile factors from the extracted factors.

16. The computer-program product of claim 1, wherein the second model term is associated with the second subject factor in the predictive computer model; and wherein the predictive computer model is generated using multinomial logistic regression.

17. The computer-program product of claim 1, wherein the instructions are operable to cause the first computing system to:

obtain the one or more profile factors by receiving multiple profile factors;

generate, based on the predictive computer model, data representing means and variances for the multiple profile factors;

update at least one mean and at least one variance accounting for the selection of the first level for the first subject factor, wherein the second model term is associated with the first profile factor in the predictive model; and wherein the generating the computer-generated representation of the fixed-factor model comprises generating the computer-generated representation of the fixed-factor model in accordance with the updated at least one mean and at least one variance.

18. The computer-program product of claim 1, wherein the profile factors specify multiple candidate features for different objects;

different system components; or different systems of the first environment;

wherein when the multiple candidate features define different objects for the first environment, a given subject interacts with the different objects by selecting between the different objects in the first experiment;

wherein when the multiple candidate features define different system components for the first environment, the given subject interacts with the different system components by selecting between the different system components in the first experiment; and wherein when the multiple candidate features define different systems for the first environment, the given subject interacts with the different systems by selecting between the different systems in the first experiment.

19. The computer-program product of claim 1, wherein the first environment is according to a screening stage of a multi-stage computing process where the different subjects represent different demographic categories of a population defining subpopulations; wherein the one or more subject factors are defined according to the different the demographic categories; wherein the second environment is according to a targeting stage of the multi-stage computing process that is specific to subpopulations of the population; and wherein instructions are operable to cause the first computing system to:

execute the multi-stage computing process;

obtain the predictive computer model by obtaining choice selections from the different subjects interacting with the first environment, and identification of demographic information pertaining to the different subjects; and generate a second experiment by controlling a second environment with subjects interacting with the second environment that are different from subjects of the first experiment but selected from a single subpopulation of the population in accordance with the selection of the first level.

20. The computer-program product of claim 1, wherein the first environment is a software environment controlling a display of a graphical user interface; wherein the one or more profile factors specify features for the display; wherein the one or more subject factors specify demographic information of users of a software tool interacting with the display; and wherein the first experiment comprises controlling the display for accessing a usability of the software environment in accordance with different displayed features according to the profile factors.

21. The computer-program product of claim 1, wherein the instructions are operable to cause the first computing system to:

display, via a graphical user interface, the computer-generated representation of the fixed-factor model;

receive a request to change the computer-generated representation of the fixed-factor model;

generate, based on the request, an updated computer-generated representation; and generate, based on the updated computer-generated representation, a design for a second experiment specific to the first level for the first subject factor.

22. The computer-program product of claim 1, wherein the instructions are operable to cause the first computing system to generate the computer-generated representation by:

obtaining multiple subject factors for the one or more subject factors;

receiving the selection by receiving a selection set with a single level for each of the multiple subject factors, wherein the receiving the selection set indicates each of the multiple subject factors is fixed for generating the computer-generated representation of the fixed-factor model; and generating a design for a second experiment specific to the selection set;

wherein the fixed-factor model predicts multiple candidate outcomes for a second environment for a second experiment with subjects defined by the selection set; and wherein in the design each of the multiple candidate features specified by the one or more profile factors is represented in the design.

23. The computer-program product of claim 1, wherein the multiple factors further comprise one or more context factors; wherein options for a given context factor specify different uses in a given environment for conducting a given experiment; and wherein the receiving comprises receiving a selection set with a setting for a first context factor of the one or more context factors specifying a single use of the different uses for the second environment for the fixed-factor model.

24. A computer-implemented method comprising:

obtaining, by a first computing system, multiple factors for a first environment in a first experiment, wherein the multiple factors comprise:

one or more profile factors, wherein each profile factor of the one or more profile factors specifies multiple candidate features for the first environment; and one or more subject factors, wherein each subject factor of the one or more subject factors specifies multiple candidate levels categorizing different subjects interacting with the first environment;

obtaining, by the first computing system, a predictive computer model for predicting probabilities of multiple candidate outcomes for the first environment, wherein the predictive computer model has weighted model terms representing a contribution of the multiple factors to a given predictive outcome for the predictive computer model, wherein the weighted model terms for the predictive computer model comprise a first model term and a second model term, wherein the first model term is associated with a first subject factor in the predictive computer model and the second model term is associated with a first profile factor, or a second subject factor, in the predictive computer model; and generating, by the first computing system, a computer-generated representation of a fixed-factor model by:

receiving a selection of a first level for the first subject factor in the predictive computer model, wherein the receiving the selection indicates to fix the first level for the first subject factor;

automatically generating for the fixed-factor model a different weight for the second model term from the predictive computer model, wherein the different weight accounts for the first level for the first subject factor that is fixed responsive to the selection; and generating, based on the different weight of the second model term and the first level for the first subject factor that is fixed, the a computer-generated representation of the fixed-factor model, wherein the fixed-factor model predicts multiple candidate outcomes for a second environment with subjects defined by the selection of the first level, and wherein the computer-generated representation of the fixed-factor model is generated from the predictive computer model without using model training data.

25. The computer-implemented method of claim 24, wherein the computer-implemented method comprises generating, based on the computer-generated representation of the fixed-factor model, a design for a second experiment specific to the first level for the first subject factor; wherein the design specifies multiple stages in the second experiment; and wherein each stage of the multiple stages specifies a single candidate feature for each of profile factors of the one or more of the multiple factors.

26. The computer-implemented method of claim 24, wherein the computer-implemented method comprises controlling a second experiment by:

generating a design for the second experiment, wherein the design specifies multiple stages in the second experiment;

wherein each stage of the multiple stages specifies a respective single candidate feature for each of profile factors of the one or more of the multiple factors; and wherein the second environment is a generated by a second computing system; and controlling, based on the design for the second experiment, the second computing system to generate specified candidate features for one or more stages of the multiple stages in the second environment.

27. The computer-implemented method of claim 24, wherein obtaining the multiple factors comprises receiving multiple subject factors; and wherein the computer-implemented method comprises:

receiving a selection of a second level; and generating multiple different fixed-factor models, wherein:

a first fixed-factor model is with respect to the selection of the first level for the first subject factor;

a second fixed-factor model is with respect to the selection of a second level; and the second level is a different level for the first subject factor from the first level or pertains to the second subject factor.

28. The computer-implemented method of claim 24, wherein the obtaining the predictive computer model comprises:

generating a design for the first experiment based on the one or more profile factors, wherein the design specifies candidate features for the one or more profile factors for conducting the first experiment;

obtaining input data based on recorded levels for the one or more subject factors from conducting the first experiment according to the design of the first experiment;

obtaining output data based on recorded outputs from conducting the first experiment according to the design of the first experiment; and training the predictive computer model based on the input data and output data.

29. The computer-implemented method of claim 24, wherein the generating the computer-generated representation of the fixed-factor model comprises generating parameter estimates for model terms of the fixed-factor model; and wherein the computer-implemented method comprises generating a design for a second experiment that is a D-optimal design that minimizes a covariance of the parameter estimates.

30. A computing device comprising processor and memory, the memory containing instructions executable by the processor wherein the computing device is configured to:

obtain, by a first computing system, multiple factors for a first environment in a first experiment, wherein the multiple factors comprise:

one or more profile factors, wherein each profile factor of the one or more profile factors specifies multiple candidate features for the first environment; and one or more subject factors, wherein each subject factor of the one or more subject factors specifies multiple candidate levels categorizing different subjects interacting with the first environment;

obtain, by the first computing system, a predictive computer model for predicting probabilities of multiple candidate outcomes for the first environment, wherein the predictive computer model has weighted model terms representing a contribution of the multiple factors to a given predictive outcome for the predictive model, wherein the weighted model terms for the predictive computer model comprise a first model term and a second model term, wherein the first model term is associated with a first subject factor in the predictive computer model and the second model term is associated with a first profile factor, or a second subject factor, in the predictive computer model; and generate, by the first computing system, a computer-generated representation of a fixed-factor model by:

receiving a selection of a first level for the first subject factor in the predictive computer model, wherein the receiving the selection indicates to fix the first level for the first subject factor;

automatically generating for the fixed-factor model a different weight for the second model term from the predictive computer model, wherein the different weight accounts for the first level for the first subject factor that is fixed responsive to the selection; and generating, based on the different weight of the second model term and the first level for the first subject factor that is fixed, the computer-generated representation of the fixed-factor model, wherein the fixed-factor model predicts multiple candidate outcomes for a second environment with subjects defined by the selection of the first level, and wherein the computer-generated representation of the fixed-factor model is generated from the predictive model without using model training data.

* * * * *